US011569254B2

(12) United States Patent
Ramkumar et al.

(10) Patent No.: US 11,569,254 B2
(45) Date of Patent: Jan. 31, 2023

(54) METHOD OF ONO INTEGRATION INTO LOGIC CMOS FLOW

(71) Applicant: LONGITUDE FLASH MEMORY SOLUTIONS LTD., Dublin (IE)

(72) Inventors: Krishnaswamy Ramkumar, San Jose, CA (US); Bo Jin, Cupertino, CA (US); Fredrick B. Jenne, Mountain House, CA (US)

(73) Assignee: LONGITUDE FLASH MEMORY SOLUTIONS LTD., Dublin (IE)

( * ) Notice: Subject to any disclaimer, the term of this patent is extended or adjusted under 35 U.S.C. 154(b) by 101 days.

(21) Appl. No.: 16/914,830

(22) Filed: Jun. 29, 2020

(65) Prior Publication Data

US 2021/0188629 A1 Jun. 24, 2021

Related U.S. Application Data

(63) Continuation of application No. 14/824,051, filed on Aug. 11, 2015, now Pat. No. 10,700,083, which is a
(Continued)

(51) Int. Cl.
*H01L 27/11568* (2017.01)
*H01L 21/28* (2006.01)
(Continued)

(52) U.S. Cl.
CPC ........ *H01L 27/11568* (2013.01); *B82Y 10/00* (2013.01); *H01L 21/31116* (2013.01);
(Continued)

(58) Field of Classification Search
CPC ..... H01L 21/823431; H01L 21/823821; H01L 27/105; H01L 21/28282; H01L 27/1052;
(Continued)

(56) References Cited

U.S. PATENT DOCUMENTS 6,479,339 B2   11/2002   Nandakumar et al.
6,548,856 B1   4/2003   Lin et al.
(Continued)

FOREIGN PATENT DOCUMENTS

CN   102810541 A   * 12/2012
JP   2011124240 A   6/2011
(Continued)

OTHER PUBLICATIONS

Peiqi Xuan, et al., "FinFET SONOS Flash Memory for Embedded Applications", IEEE Int Electron Dev Meetings 2003, Dec. 8-10, 2003, pp. 609-612.
(Continued)

*Primary Examiner* — Peter Bradford
(74) *Attorney, Agent, or Firm* — Kunzler Bean & Adamson

(57) ABSTRACT

An embodiment of a method of integration of a non-volatile memory device into a logic MOS flow is described. Generally, the method includes: forming a pad dielectric layer of a MOS device above a first region of a substrate; forming a channel of the memory device from a thin film of semiconducting material overlying a surface above a second region of the substrate, the channel connecting a source and drain of the memory device; forming a patterned dielectric stack overlying the channel above the second region, the patterned dielectric stack comprising a tunnel layer, a charge-trapping layer, and a sacrificial top layer; simultaneously removing the sacrificial top layer from the second region of the substrate, and the pad dielectric layer from the first region of the substrate; and simultaneously forming a gate dielectric layer above the first region of the substrate and a blocking dielectric layer above the charge-trapping layer.

18 Claims, 23 Drawing Sheets

Related U.S. Application Data continuation of application No. 13/434,347, filed on Mar. 29, 2012, now Pat. No. 9,102,522, which is a continuation-in-part of application No. 13/312,964, filed on Dec. 6, 2011, now Pat. No. 9,023,707, which is a continuation of application No. 12/608,886, filed on Oct. 29, 2009, now Pat. No. 8,071,453.

(60) Provisional application No. 61/183,021, filed on Jun. 1, 2009, provisional application No. 61/172,324, filed on Apr. 24, 2009.

(51) Int. Cl.

| | | |
|---|---|---|
| H01L 29/66 | (2006.01) | |
| H01L 29/792 | (2006.01) | |
| H01L 27/11573 | (2017.01) | |
| H01L 21/8234 | (2006.01) | |
| H01L 21/8238 | (2006.01) | |
| H01L 27/105 | (2006.01) | |
| H01L 21/311 | (2006.01) | |
| H01L 21/3213 | (2006.01) | |
| H01L 27/11582 | (2017.01) | |
| H01L 29/10 | (2006.01) | |
| H01L 29/423 | (2006.01) | |
| H01L 29/49 | (2006.01) | |
| B82Y 10/00 | (2011.01) | |

(52) U.S. Cl.
CPC ........... *H01L 21/32135* (2013.01); *H01L 21/823431* (2013.01); *H01L 21/823821* (2013.01); *H01L 27/105* (2013.01); *H01L 27/1052* (2013.01); *H01L 27/11573* (2013.01); *H01L 27/11582* (2013.01); *H01L 29/1033* (2013.01); *H01L 29/40117* (2019.08); *H01L 29/42352* (2013.01); *H01L 29/4925* (2013.01); *H01L 29/66833* (2013.01); *H01L 29/792* (2013.01); *H01L 29/7926* (2013.01)

(58) Field of Classification Search
CPC ............. H01L 29/792; H01L 29/7926; H01L 27/11568; H01L 27/11573; H01L 29/66833; B82Y 10/00
See application file for complete search history.

(56) References Cited

U.S. PATENT DOCUMENTS

| | | | |
|---|---|---|---|
| 6,818,558 B1 | 11/2004 | Rathor et al. | |
| 6,946,349 B1 | 11/2005 | Lee et al. | |
| 6,949,787 B2 | 11/2005 | Snyder et al. | |
| 7,091,089 B2 | 8/2006 | Steimle | |
| 7,091,130 B1 | 8/2006 | Rao et al. | |
| 7,315,474 B2 | 1/2008 | Lue | |
| 7,390,718 B2 | 6/2008 | Roizin et al. | |
| 7,429,767 B2 | 9/2008 | Bhattacharyya | |
| 7,514,323 B2 | 4/2009 | Dobuzinski et al. | |
| 7,678,662 B2 | 3/2010 | Arghavani et al. | |
| 7,651,915 B2 | 6/2010 | Yan et al. | |
| 7,811,886 B2 | 10/2010 | Winstead et al. | |
| 7,811,887 B2 | 10/2010 | Irani et al. | |
| 7,816,728 B2 | 10/2010 | Ho et al. | |
| 7,972,929 B2 | 7/2011 | Lee | |
| 8,071,453 B1 | 12/2011 | Ramkumar et al. | |
| 8,093,128 B2 | 1/2012 | Koutny, Jr. et al. | |
| 8,120,095 B2 | 2/2012 | Ho et al. | |
| 8,222,688 B1 | 7/2012 | Jenne et al. | |
| 8,614,124 B2 | 12/2013 | Jenne et al. | |
| 2002/0079564 A1 | 6/2002 | Vajana et al. | |
| 2002/0145159 A1 | 10/2002 | Ishii et al. | |
| 2003/0219947 A1 | 11/2003 | Shin et al. | |
| 2004/0110390 A1 | 6/2004 | Takagi et al. | |
| 2004/0183122 A1 | 9/2004 | Mine et al. | |
| 2005/0110102 A1 | 5/2005 | Wang et al. | |
| 2005/0202615 A1 | 9/2005 | Duan et al. | |
| 2006/0035432 A1 | 2/2006 | Kim et al. | |
| 2006/0113605 A1 | 6/2006 | Currie | |
| 2006/0284236 A1 | 12/2006 | Bhattacharyya | |
| 2007/0018201 A1 | 1/2007 | Specht et al. | |
| 2007/0087503 A1 | 4/2007 | Lusky | |
| 2007/0108497 A1 | 5/2007 | Shih et al. | |
| 2007/0132054 A1 | 6/2007 | Arghavani et al. | |
| 2007/0284654 A1 | 12/2007 | Rubino et al. | |
| 2008/0090350 A1 | 4/2008 | Yan et al. | |
| 2008/0121983 A1 | 5/2008 | Seong et al. | |
| 2008/0173928 A1 | 7/2008 | Arai et al. | |
| 2008/0290400 A1 | 11/2008 | Jenne et al. | |
| 2008/0293207 A1 | 11/2008 | Koutny, Jr. et al. | |
| 2008/0293254 A1 | 11/2008 | Ramkumar et al. | |
| 2008/0296661 A1 | 12/2008 | Ramkumar et al. | |
| 2008/0296664 A1 | 12/2008 | Ramkumar et al. | |
| 2008/0296693 A1 | 12/2008 | Richter et al. | |
| 2009/0086548 A1 | 4/2009 | Wu et al. | |
| 2009/0104780 A1 | 4/2009 | Lee | |
| 2009/0108331 A1 | 4/2009 | Lai et al. | |
| 2009/0121271 A1 | 5/2009 | Son et al. | |
| 2009/0152621 A1 | 6/2009 | Polishchuk et al. | |
| 2009/0179254 A1 | 7/2009 | Van et al. | |
| 2009/0181530 A1 | 7/2009 | Lisiansky et al. | |
| 2010/0109065 A1 | 5/2010 | Oh et al. | |
| 2010/0112769 A1 | 5/2010 | Son et al. | |
| 2010/0123181 A1 | 5/2010 | Park et al. | |
| 2010/0140684 A1 | 6/2010 | Ozawa | |
| 2010/0200908 A1 | 8/2010 | Lee et al. | |
| 2010/0276667 A1 | 11/2010 | Kim et al. | |
| 2011/0044026 A1 | 2/2011 | Deeben et al. | |
| 2011/0049612 A1 | 3/2011 | Higuchi et al. | |
| 2011/0233512 A1 | 9/2011 | Yang et al. | |
| 2011/0233646 A1 | 9/2011 | Mizushima et al. | |
| 2011/0248332 A1 | 10/2011 | Levy et al. | |
| 2011/0275182 A1 | 11/2011 | Mouli | |
| 2011/0291177 A1* | 12/2011 | Lee ................ H01L 29/40117 | |
| | | | 257/E21.423 |
| 2012/0001247 A1 | 1/2012 | Alsmeier | |
| 2012/0037977 A1 | 2/2012 | Lee et al. | |
| 2012/0058629 A1* | 3/2012 | You ................ H01L 21/02104 | |
| | | | 438/479 |
| 2012/0068242 A1 | 3/2012 | Shin et al. | |
| 2012/0068250 A1 | 3/2012 | Ino et al. | |
| 2012/0185753 A1 | 7/2012 | Chen et al. | |
| 2012/0267701 A1 | 10/2012 | Chae et al. | |
| 2013/0155771 A1* | 6/2013 | Kim ................ H01L 21/32133 | |
| | | | 257/314 |
| 2013/0175599 A1 | 7/2013 | Yang et al. | |

FOREIGN PATENT DOCUMENTS

| | | | |
|---|---|---|---|
| KR | 20080079492 A | * | 9/2008 |
| TW | 201133795 A | | 10/2011 |
| WO | 2013148196 A1 | | 10/2013 |

OTHER PUBLICATIONS

"Implementation Of High-k/Metal Gates In High-Volume Manufacturing", The transistor is cool again. White Paper, Applied Materials, No Date, pp. 1-5.

Hwang, "Bringing Non-Volatile Memory Blocks to SOCS Using the SONOS Process", by Dr. Jeong-Mo (James) Hwang, Chip Design, Tools, Technologies & Methodologies, Simtek Corporation, No Date, pp. 1-11.

\* cited by examiner

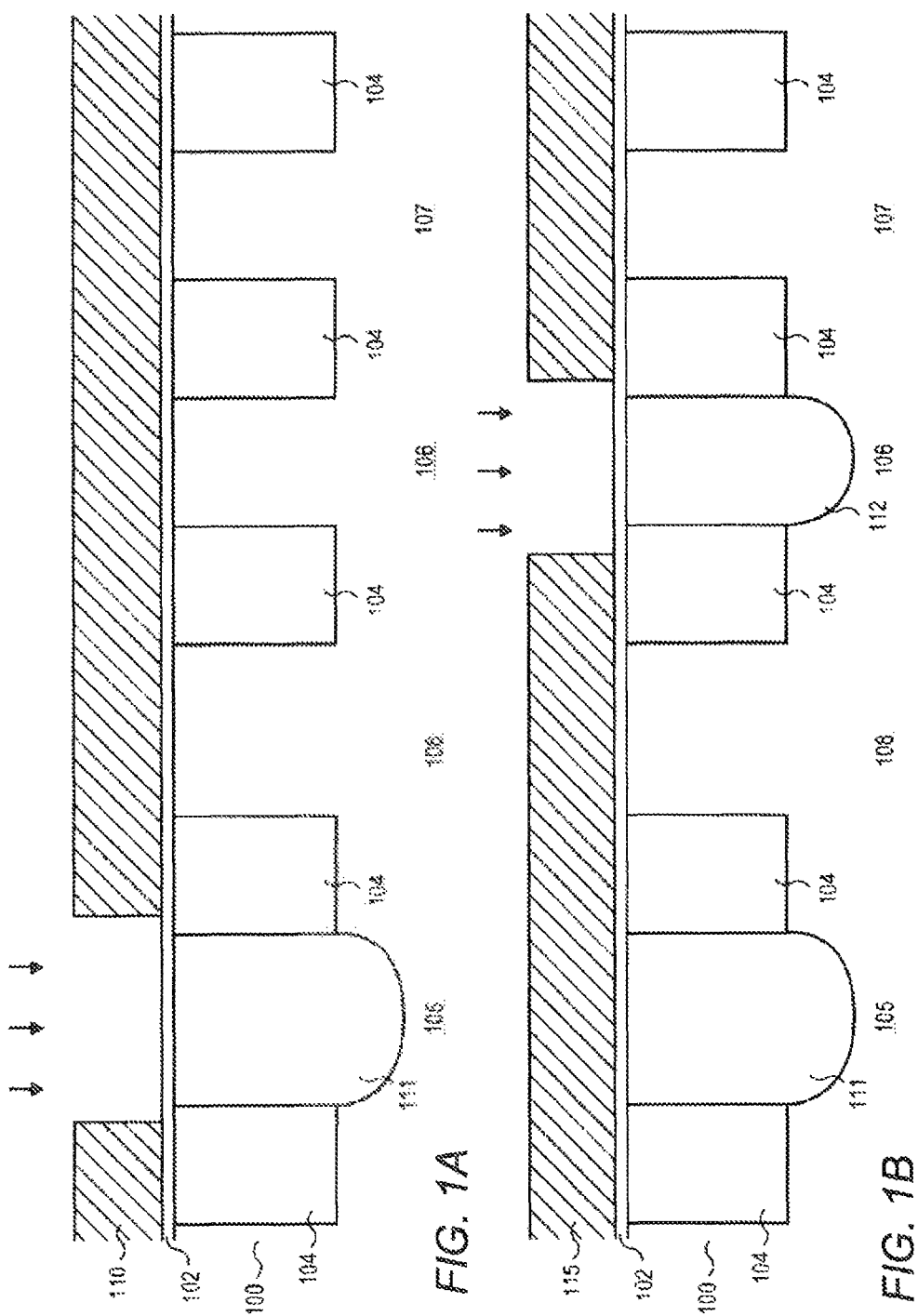

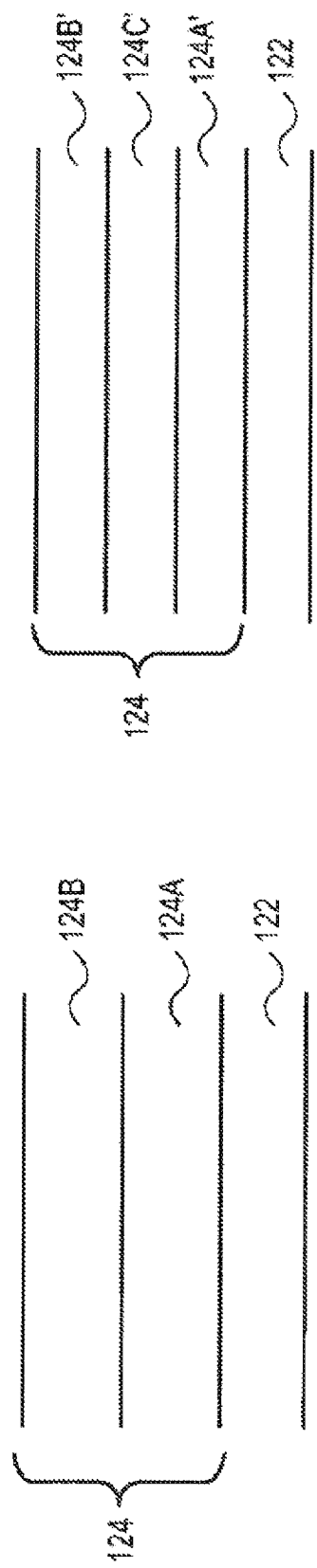

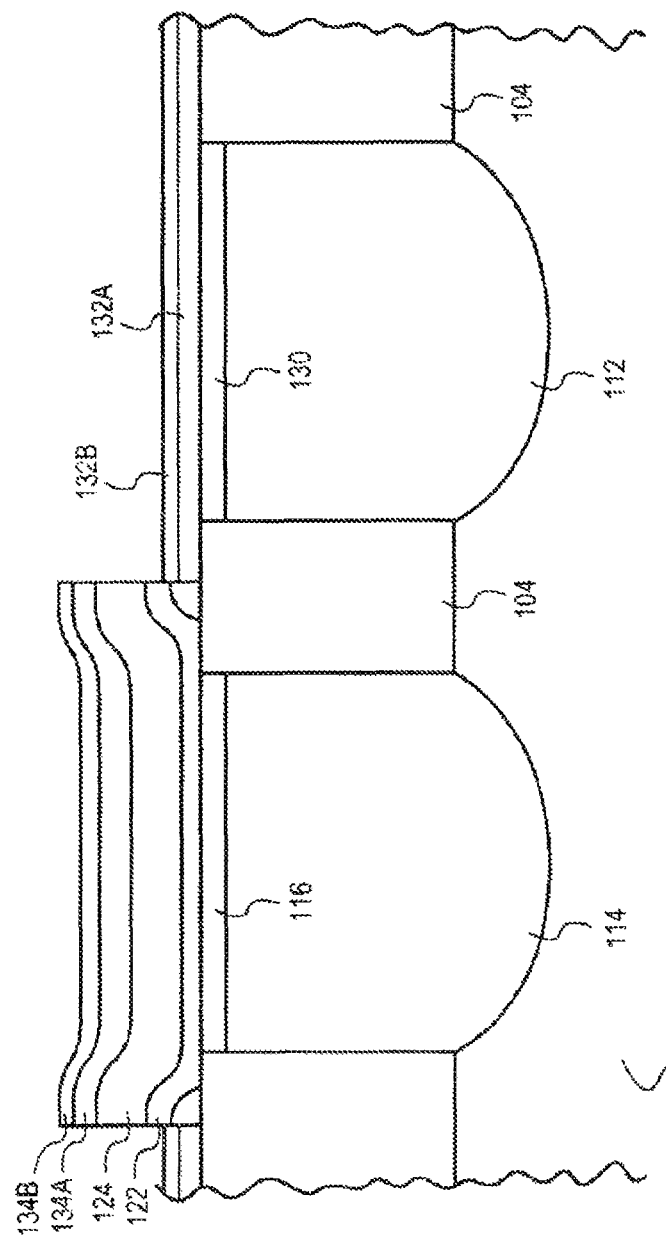

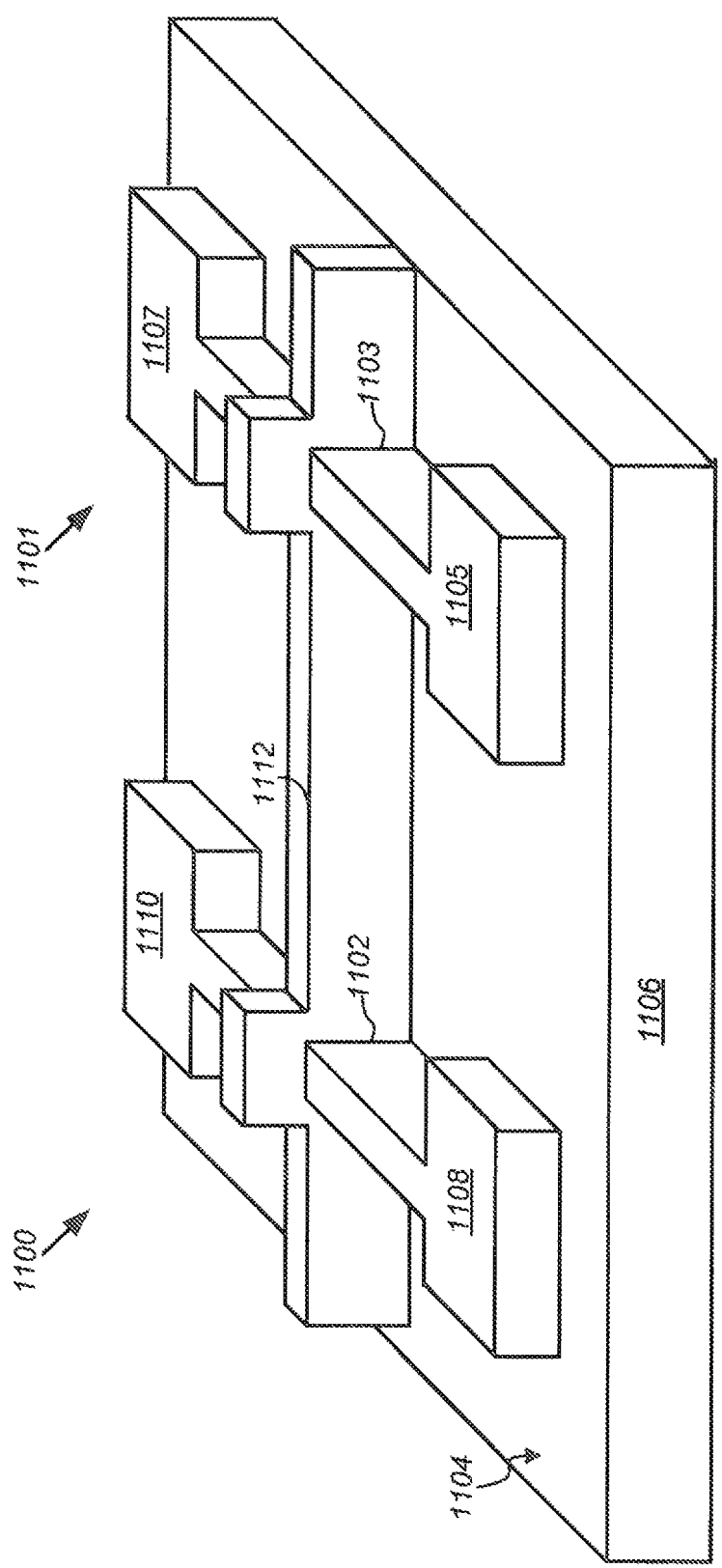

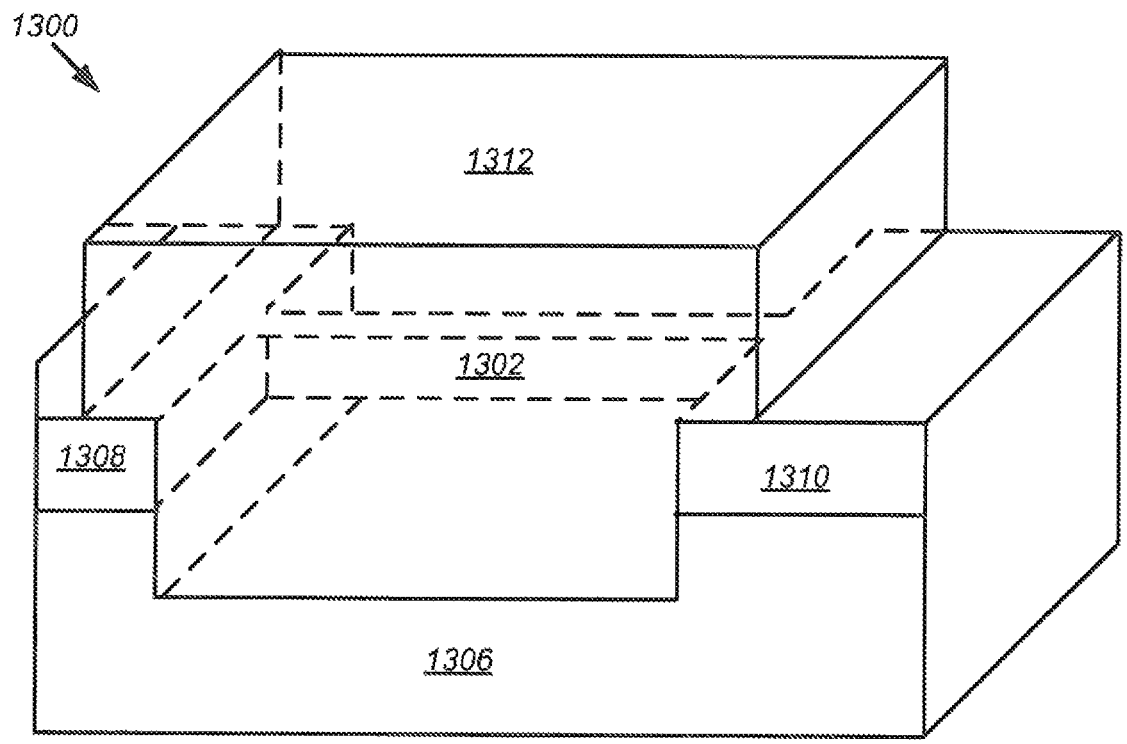
FIG. 13A
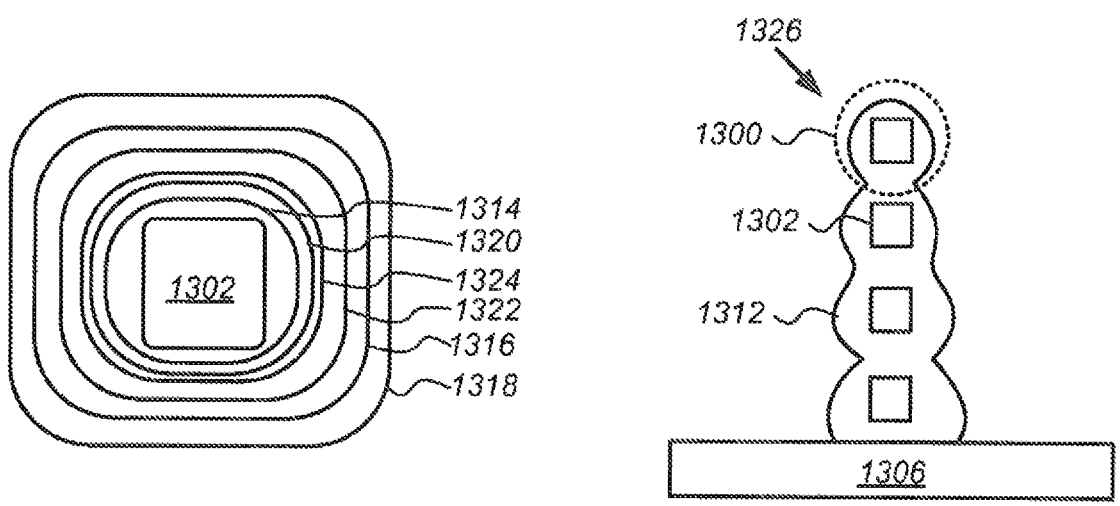
FIG. 13B
FIG. 13C

METHOD OF ONO INTEGRATION INTO LOGIC CMOS FLOW

RELATED APPLICATIONS

This application is a continuation of U.S. patent application Ser. No. 14/824,051, filed Aug. 11, 2015, which is a continuation of U.S. patent application Ser. No. 13/434,347, filed Mar. 29, 2012, Now U.S. Pat. No. 9,102,522, Issued Aug. 11, 2015, Which is a continuation in part of U.S. application Ser. No. 13/312,964 filed Dec. 6, 2011, Now U.S. Pat. No. 9,023,707, Issued May 5, 2015. Which is a continuation of U.S. application Ser. No. 12/608,886, filed Oct. 29, 2009, Now U.S. Pat. No. 8,071,453, Issued Dec. 6, 2011, claims the benefit of U.S. Provisional Application No. 61/183,021, filed Jun. 1, 2009, and U.S. Provisional Application No. 61/172,324, filed Apr. 24, 2009, all of which are incorporated by reference herein in their entirety.

TECHNICAL FIELD

Embodiments of the present invention relate to the field of semiconductor device.

The fabrication of integrated circuits for logic products typically includes a baseline process for the production of metal-oxide-semiconductor field-effect transistors (MOSFET). Thicknesses, geometries, alignment, concentrations, etc. are stringently controlled for each operation in such a baseline process to ensure that they are within specific tolerance range so that the resultant MOSFETs will function properly. For applications such as system-on-chip silicon-oxide-nitride-oxide-semiconductor (SONOS) FETs are often integrated into a MOSFET logic manufacturing process. This integration can seriously impact the baseline MOSFET process, and generally requires several mask sets and expense.

BRIEF DESCRIPTION OF THE DRAWINGS

These and various other features and advantages of the present structure and method will be apparent upon reading of the following detailed description in conjunction with the accompanying drawings and the appended claims provided below, where:

FIGS. 1A-1D illustrate the formation of deep wells in the substrate, in accordance with an embodiment of the present invention.

FIGS. 3B-3C illustrate multiple layer charge-trapping layers, in accordance with an embodiment of the present invention.

FIGS. 7B-7C illustrate the formation of a blocking dielectric layer consuming a portion of a charge-trapping layer, in accordance with an embodiment of the present invention.

FIG. 7D illustrates a multiple layer gate dielectric layer and multiple layer blocking dielectric layer, in accordance with an embodiment of the present invention.

FIG. 11A illustrates a non-planar multigate device including a split charge-trapping region;

FIGS. 13A and 13B illustrate a non-planar multigate device including a split charge-trapping region and a horizontal nanowire channel.

FIG. 13C illustrates a cross-sectional view of a vertical string of non-planar multigate devices of FIG. 13A.

DETAILED DESCRIPTION

Figure 1C:
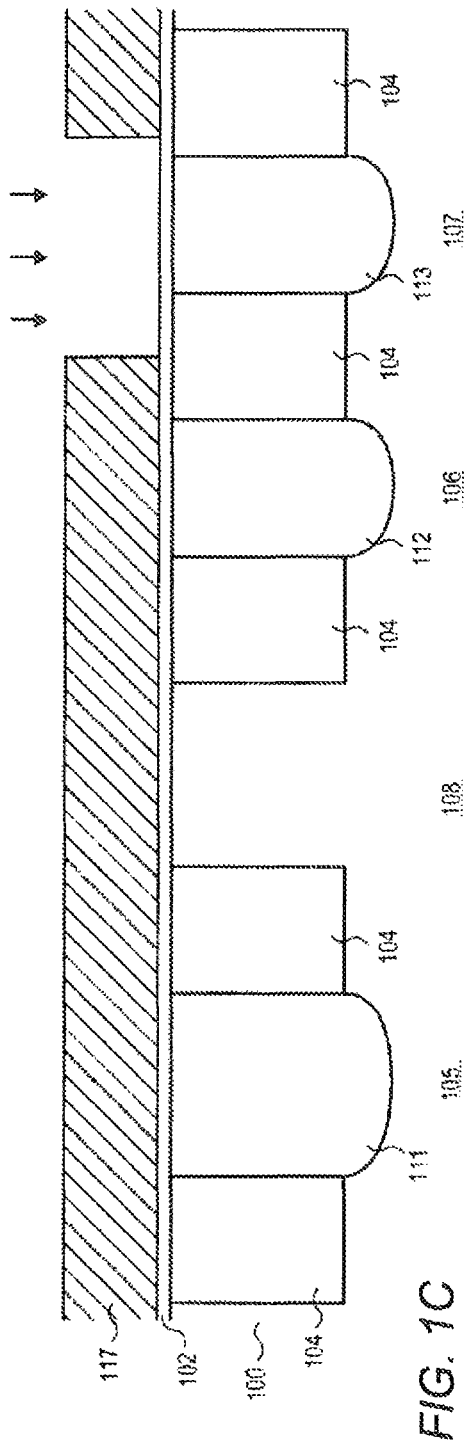

Embodiments of the present invention disclose methods of ONO integration into a MOS flow. In the following description, numerous specific details are set forth, such as specific configurations, compositions, and processes, etc., in order to provide a thorough understanding of the present invention. In other instances, well-known processes and manufacturing techniques have not been described in particular detail in order to not unnecessarily obscure the present invention. Furthermore, it is to be understood that the various embodiments shown in the Figures are illustrative representations and are not necessarily drawn to scale.

The terms "above," "over," "between," and "on" as used herein refer to a relative position of one layer with respect to other layers. One layer deposited or disposed above or under another layer may be directly in contact with the other layer or may have one or more intervening layers. One layer deposited or disposed between layers may be directly in contact with the layers or may have one or more intervening layers. In contrast, a first layer "on" a second layer is in contact with that second layer.

A method of integrating a non-volatile memory device and a metal-oxide-semiconductor (MOS) device is described. In an embodiment, the MOS device is a volatile memory device, logic device and/or analog device. While particular embodiments of the invention are described herein with reference to a MOSFET device, it is understood that embodiments are not so limited. In an embodiment, the non-volatile memory device is any device with an oxide-nitride-oxide (ONO) dielectric stack. In an embodiment, the non-volatile memory device is an erasable-programmable-read-only memory EEPROM device. In one embodiment, the non-volatile memory device is a floating gate FLASH device. In another embodiment, the non-volatile memory device is a non-volatile charge trap memory device such as a semiconductor-oxide-nitride-oxide-semiconductor (SONOS). The first "semiconductor" in SONOS refers to a channel region material, the first "oxide" refers to a tunnel layer, "nitride" refers to a charge-trapping layer, the second "oxide" refers to a blocking dielectric layer, and the second "semiconductor" refers to a gate layer. A SONOS-type device, however, is not limited to these specific materials. For example, depending upon the specific device, the charge-trapping layer could include a conductor layer, semiconductor layer, or insulator layer. While the following embodiments of the present invention are described with reference to illustrations of a SONOS non-volatile memory device, embodiments are not limited to such.

In one aspect, embodiments of the invention disclose simultaneously forming the gate dielectric layer of a MOS device (e.g. MOSFET) and the top ONO layer of a non-volatile memory device (e.g. the blocking dielectric layer a SONOS FET). Fabrication of the ONO dielectric stack may be integrated into the baseline MOSFET manufacturing process for forming the MOSFET gate dielectric layer. A pad dielectric layer is formed above a volatile device region of a substrate. A patterned dielectric stack is formed above a non-volatile device region of the substrate. The patterned dielectric stack may comprise a tunnel layer, charge-trapping layer, and sacrificial top layer. The sacrificial top layer is then removed from the dielectric stack in the non-volatile device region of the substrate. The pad dielectric layer is removed from the volatile device region of the substrate. Then, simultaneously, a gate dielectric layer is formed above the volatile device region of the substrate and a blocking dielectric layer is formed above the charge-trapping layer above the non-volatile device region of the substrate.

In another aspect, embodiments of the invention disclose forming the first oxide and nitride layers of an ONO dielectric stack prior to adding channel implants to the MOS device (e.g. MOSFET). The thermal budget of forming the ONO dielectric stack may not impact the channel dopant profile for the MOS device. A pad dielectric layer is blanket deposited or grown above the substrate. SONOS channel dopants are implanted into the non-volatile device region of the substrate. The pad dielectric layer is removed from the non-volatile device region of the substrate, and a dielectric stack is formed above the non-volatile device region of the substrate where the pad dielectric layer has been removed. The patterned dielectric stack may comprise a tunnel layer, charge-trapping layer, and sacrificial top layer. MOSFET channel dopants are then implanted through the pad dielectric layer and into the MOS region of the substrate. The pad dielectric layer is removed from the MOS device region of the substrate simultaneously with the sacrificial top layer from the non-volatile device region of the substrate.

Referring to FIG. 1A, in an embodiment, the process begins with forming a protective pad layer 102 above the surface of a substrate 100. Substrate 100 may be composed of any material suitable for semiconductor device fabrication. In one embodiment, substrate 100 is a bulk substrate composed of a single crystal of a material which may include, but is not limited to, silicon, germanium, silicon-germanium or a III-V compound semiconductor material. In another embodiment, substrate 100 includes a bulk layer with a top epitaxial layer. In a specific embodiment, the bulk layer is composed of a single crystal of a material which may include but is not limited to, silicon, germanium, silicon-germanium, a III-V compound semiconductor material and quartz, while the top epitaxial layer is composed of a single crystal layer which may include, but is not limited to, silicon, germanium, silicon-germanium and a III-V compound semiconductor material. In another embodiment, substrate 100 includes a top epitaxial layer above a middle insulator layer which is above a lower bulk layer. For example, the insulator may be composed of a material such as silicon dioxide, silicon nitride and silicon oxy-nitride.

Isolation regions 104 may be formed in the substrate 100. In an embodiment, isolation regions 104 separate a MOS device region and a non-volatile device region. In a particular embodiment, isolation regions 104 separate a high voltage field-effect transistor (HVFET) region 105, a SONOS FET region 108, an in/out select field-effect transistor (10 FET) 106 and a low voltage field-effect transistor (LVFET) region 107. In an embodiment, substrate 100 is a silicon substrate, pad layer 102 is silicon oxide, and isolation regions 104 are shallow trench isolation regions. Pad layer 102 may be a native oxide, or alternatively a thermally grown or deposited layer. In an embodiment, pad layer 102 is thermally grown with a dry oxidation technique at a temperature of 800° C.-900° C. to a thickness of approximately 100 angstroms (Å).

Figure 1D:
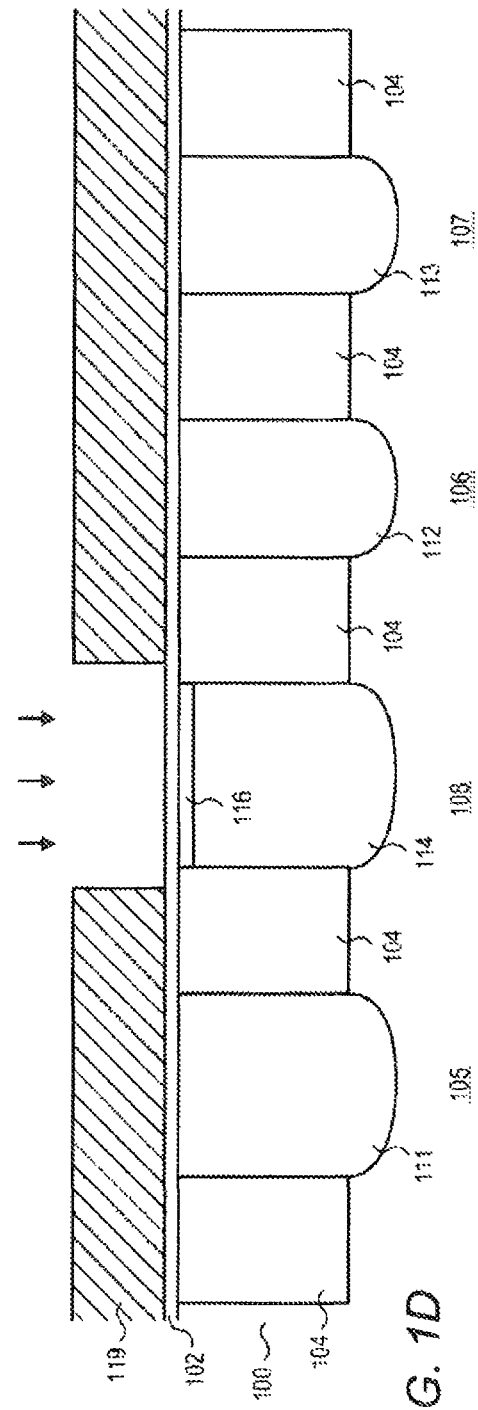

Dopants are then implanted into substrate 100 to form deep wells of any dopant type and concentration. FIGS. 1A-1D illustrate the separate formation of deep wells for each particular device region of the substrate, however, it is to be appreciated that deep wells can be formed for multiple device regions of the substrate at the same time. In a particular embodiment illustrated in FIG. 1A, photoresist layer 110 is formed above pad layer 102 and patterned to form an opening above HVFET region 105. Dopants are implanted into the substrate to form deep well 111 in HVFET region 105 of the substrate. As illustrated in FIG. 1B, lithographic techniques, patterning, and implantation can be used to form a separate patterned photoresist layer 115 and deep well 112 in 10 FET region 106. As illustrated in FIG. 1C, lithographic techniques, patterning, and implantation can be used to form a separate patterned photoresist layer 117 and deep well 113 in LVFET region 107. As illustrated in FIG. 1D, lithographic techniques, patterning, and implantation can be used to form a separate patterned photoresist layer 119 and deep well 114 in SONOS FET region 108. Dopants are also implanted into substrate 100 to form doped channel region 116. As illustrated in the embodiment of FIG. 1D, doped channel regions are not formed in the MOSFET regions 105, 106, or 107 so that out-diffusion does not occur during subsequent high temperature operations, and the baseline MOSFET fabrication process for the doped channel region does not need to be altered.

In another embodiment, doped channel regions are also formed for the 10 FET region 106, LVFET region 107 and HVFET region 105 during the implantation operations illustrated in FIG. 1A-1D. In such an embodiment, the doped channel regions may diffuse during subsequent processing operations. Accordingly, such diffusion may need to be factored into a redesigned baseline MOSFET fabrication process.

Figure 2A:
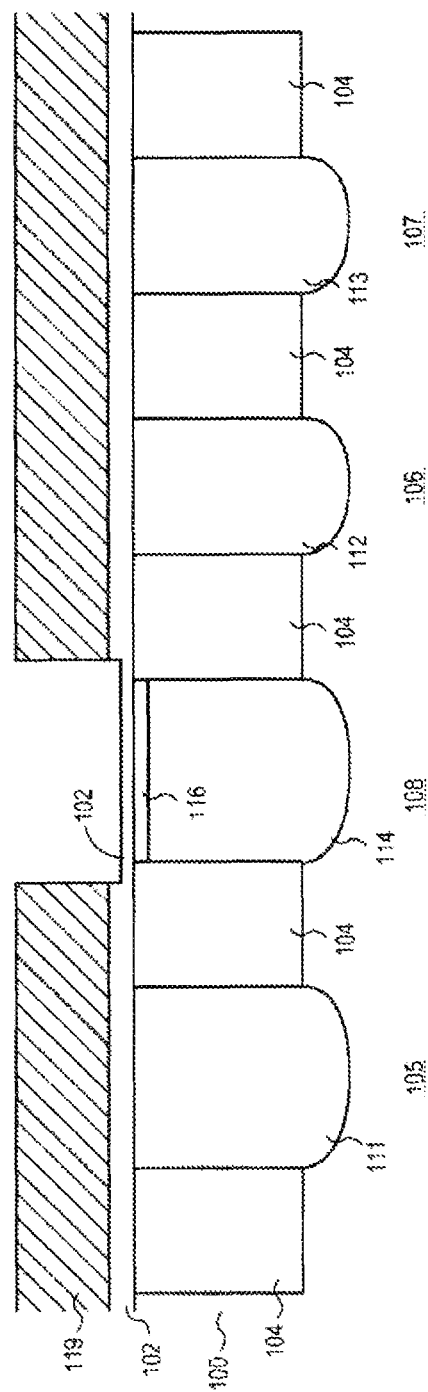
FIGS. 2A-2B illustrate removing a pad layer from a non-volatile device region of a substrate, in accordance with an embodiment of the present invention.
Figure 2B:
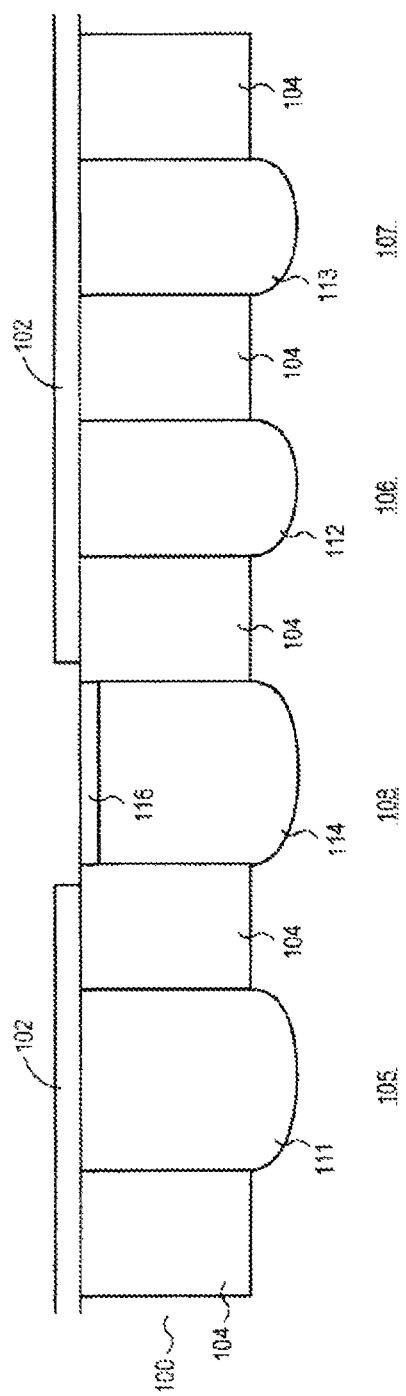

Referring to FIGS. 2A-2B, pad layer 102 is then removed from the non-volatile device region 108. In one embodiment, pad layer 102 is removed utilizing a dry-wet technique. Referring to FIG. 2A, the bulk of the pad layer 102 is removed using any suitable dry etching technique, such as a fluorine-based chemistry. In an embodiment, at least 85% of the pad layer 102 above the non-volatile device region 108 is removed with the dry etching technique. Referring to FIG. 2B, patterned photoresist layer 119 is then removed utilizing a suitable photoresist removal chemistry such as a sulfuric acid based chemistry, with an oxygen based plasma and ash, or a combination of both. A gate pre-clean chemistry is then applied to the substrate to remove the remainder of pad layer 102 from the surface of the substrate 100 in the non-volatile device region 108. In an embodiment, the pre-clean chemistry is a dilute hydrofluoric acid (HF) solution or buffered-oxide-etch (BOE) solution containing HF and ammonium fluoride ($NH_4F$). In such an embodiment, minimal lateral etching of pad layer 102 occurs in the opening above non-volatile device region 108, and pad layer 102 is also slightly etched above other regions of the substrate. In an embodiment, no more than 25% of the original thickness of pad layer 102 is removed from above regions 105, 106 and 107.

Figure 3A:
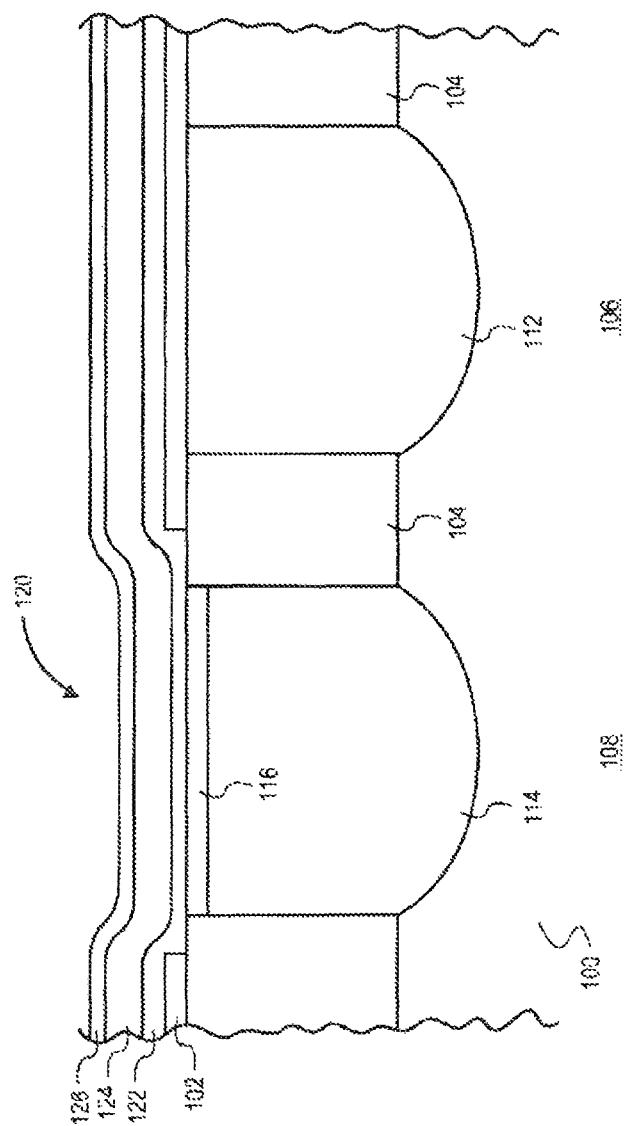
FIG. 3A illustrates the formation of a dielectric stack, in accordance with an embodiment of the present invention.

As illustrated in the embodiment of FIG. 3A, a dielectric stack 120 is then formed above the substrate 100. In an embodiment, the dielectric stack 120 includes a tunnel layer 122, a charge-trapping layer 124, and a sacrificial top layer 126. Tunnel layer 122 may be any material and have any thickness suitable to allow charge carriers to tunnel into the charge trapping layer under an applied gate bias while maintaining a suitable barrier to leakage when the device is unbiased. In an embodiment, tunnel layer 122 is silicon dioxide, silicon oxy-nitride, or a combination thereof. Tunnel layer 122 can be grown or deposited. In one embodiment, tunnel layer 122 is grown by a thermal oxidation process. For example, a layer of silicon dioxide may be grown utilizing dry oxidation at 750 degrees centigrade (° C.)-800° C. in an oxygen atmosphere. In one embodiment, tunnel layer 122 is grown by a radical oxidation process. For example, a layer of silicon dioxide may be grown utilizing in-situ steam generation (ISSG). In another embodiment, tunnel dielectric layer 122 is deposited by chemical vapor deposition or atomic layer deposition and is composed of a dielectric layer which may include, but is not limited to silicon dioxide, silicon oxy-nitride, silicon nitride, aluminum oxide, hafnium oxide, zirconium oxide, hafnium silicate, zirconium silicate, hafnium oxy-nitride, hafnium zirconium oxide and lanthanum oxide. In another embodiment, tunnel layer 122 is a bi-layer dielectric region including a bottom layer of a material such as, but not limited to, silicon dioxide or silicon oxy-nitride and a top layer of a material which may include, but is not limited to silicon nitride, aluminum oxide, hafnium oxide, zirconium oxide, hafnium silicate, zirconium silicate, hafnium oxy-nitride, hafnium zirconium oxide and lanthanum oxide. Thus, in one embodiment, tunnel layer 122 includes a high-K dielectric portion. In a specific embodiment, tunnel layer 122 has a thickness of 18-20 angstroms.

Charge-trapping layer 124 may be any material and have a thickness which is greater than the nominal thickness suitable to store charge, since a top portion of the charge trapping layer 124 is consumed during a subsequent processing operation. In an embodiment, charge trapping layer is 105-135 angstroms thick. In an embodiment, charge-trapping layer 124 is formed by a chemical vapor deposition technique and is composed of a dielectric material which may include, but is not limited to stoichiometric silicon nitride, silicon-rich silicon nitride, silicon oxy-nitride and oxygen rich silicon oxy-nitride. In an embodiment, charge trapping layer 126 includes multiple layers which are created by modifying the flow rate of ammonia ($NH_3$) gas, nitrous oxide ($N_2O$) and dichlorosilane ($SiH_2Cl_2$). The flow of dichlorosilane can be increased to create a silicon rich film such as silicon nitride. The flow rate of nitrous oxide can be increased to create an oxide rich film such as silicon oxy-nitride. The flow rate of ammonia can be increased to create a nitrogen rich film such as silicon nitride.

In one embodiment, charge-trapping layer 124 is composed of a lower layer and an upper layer, with the upper layer being more readily oxidized than the lower layer. In an embodiment, the lower layer has a greater oxygen content than the upper layer, and the upper layer has a greater silicon content than the lower layer. For example, as illustrated in FIG. 3B, charge trapping layer 124 is composed of lower layer 124A and upper layer 124B. Lower layer 124A may comprise silicon oxy-nitride which contains more oxygen than the upper layer 124B, and the upper layer 124B may comprise silicon nitride or silicon oxy-nitride which contains more silicon than the lower layer 124A. In an embodiment, lower layer 124A comprises 30%±5% oxygen, 20%±10% nitrogen, and 50%±10% silicon, by atomic percent. In an embodiment, the upper layer comprises 0-7% oxygen, 30-57% nitrogen, and 43-65% silicon, by atomic percent. In an embodiment, upper layer 124B comprises stoichiometric $Si_3N_4$. In an embodiment, the lower layer 124A is deposited by flowing dichlorosilane, ammonia and nitrous oxide into a chemical vapor deposition chamber at a temperature of approximately 750° C.-850° C. In an embodiment, lower layer 124A is 40-50 angstroms thick and upper layer 124B is approximately 70-80 angstroms thick.

In another embodiment illustrated in FIG. 3C, charge trapping layer 124 is composed of a lower layer, middle layer and upper layer. In an embodiment, lower layer 124A' is oxide rich, middle layer 124C' is silicon rich, and upper layer 124B' is silicon and/or nitrogen rich. In an embodiment, lower layer 124A' is composed of silicon oxy-nitride, middle layer 124C' is composed of silicon oxy-nitride, and upper layer 124B' is composed of silicon oxy-nitride or $SiN_4$. In an embodiment, lower layer 124A' comprises 30%±5% oxygen, 20%±10% nitrogen, and 50%±10% silicon, by atomic percent. In an embodiment, middle layer 124C' comprises 5%±2% oxygen, 40%±10% nitrogen, and 55%+/−10% silicon, by atomic percent. In an embodiment, upper layer 124B' comprises 0-7% oxygen, 30-57% nitrogen, and 43-65% silicon, by atomic percent. The thickness of upper layer 124B' is adjusted such that no more than 10% of middle layer 124C' is consumed during the operation described with regard to FIG. 7C. In an embodiment, lower layer 124A' is 40-50 angstroms thick, middle layer 124C' is 40-50 angstroms thick, and upper layer 124B' is approximately 30 angstroms thick.

Referring again to FIG. 3A, a sacrificial top layer 126 is blanket deposited above charge-trapping layer 124. In an embodiment, sacrificial top layer 126 is silicon dioxide. In an embodiment, sacrificial top layer 126 is deposited utilizing a chemical vapor deposition technique utilizing precursors such as dicholorisilane and nitrous oxide. In an embodiment, the entire dielectric stack 120 can be formed in a chemical vapor deposition chamber such as a low pressure chemical vapor deposition (LPCVD) chamber. In one embodiment, tunnel layer 122 is thermally grown in the LPCVD chamber, while charge-trapping layer 124 and sacrificial top layer 126 are both deposited in the LPCVD chamber.

Figure 4:
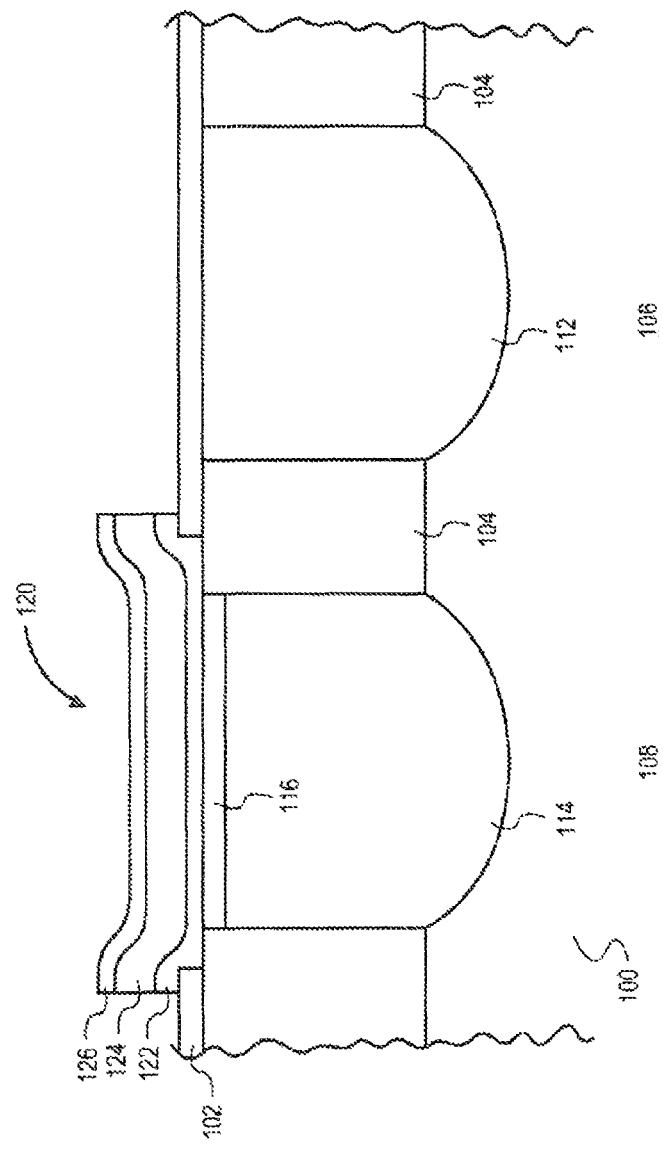
FIG. 4 illustrates a patterned dielectric stack above a non-volatile device region of a substrate, in accordance with an embodiment of the present invention.

The dielectric stack 120 is then patterned above the non-volatile device region utilizing standard lithographic techniques as illustrated in the embodiment of FIG. 4. In an embodiment, patterning comprises dry etching with a fluorine based chemistry. In an embodiment, etching stops on the pad layer 102 and does not expose substrate 100 in the MOS device region 106. In such an embodiment, the pad layer 102 can protect the top surface of substrate 100 from damage during a subsequent implantation operation. In an alternative embodiment, pad layer 102 may be removed from the substrate utilizing a conventional pre-clean chemistry such as a diluted HF solution. In such an embodiment, doped channel regions may have already been formed in the substrate during a previous processing operation, such as during the deep well formation illustrated in FIG. 1A-1D.

Figure 5A:
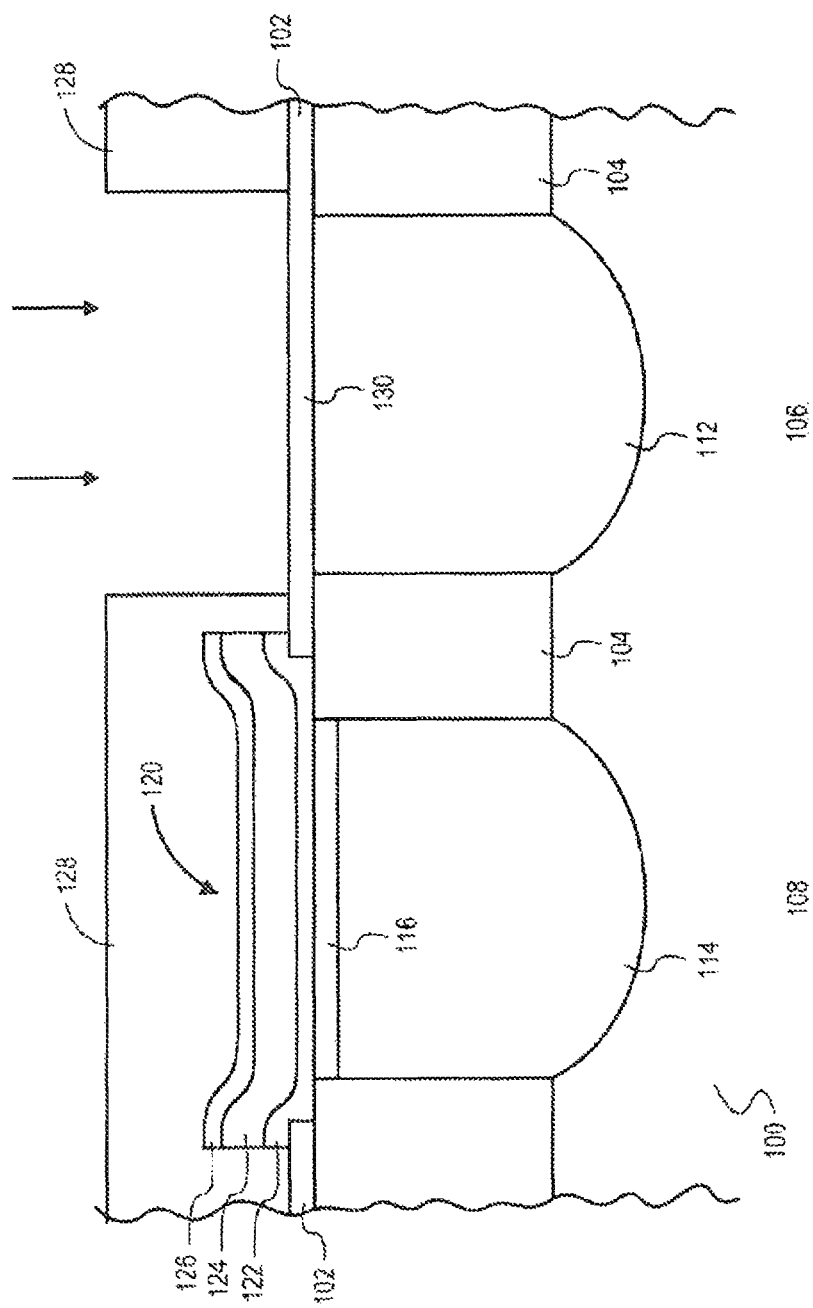
FIGS. 5A-5B illustrate the formation of doped channel regions, in accordance with an embodiment of the present invention.
Figure 5B:
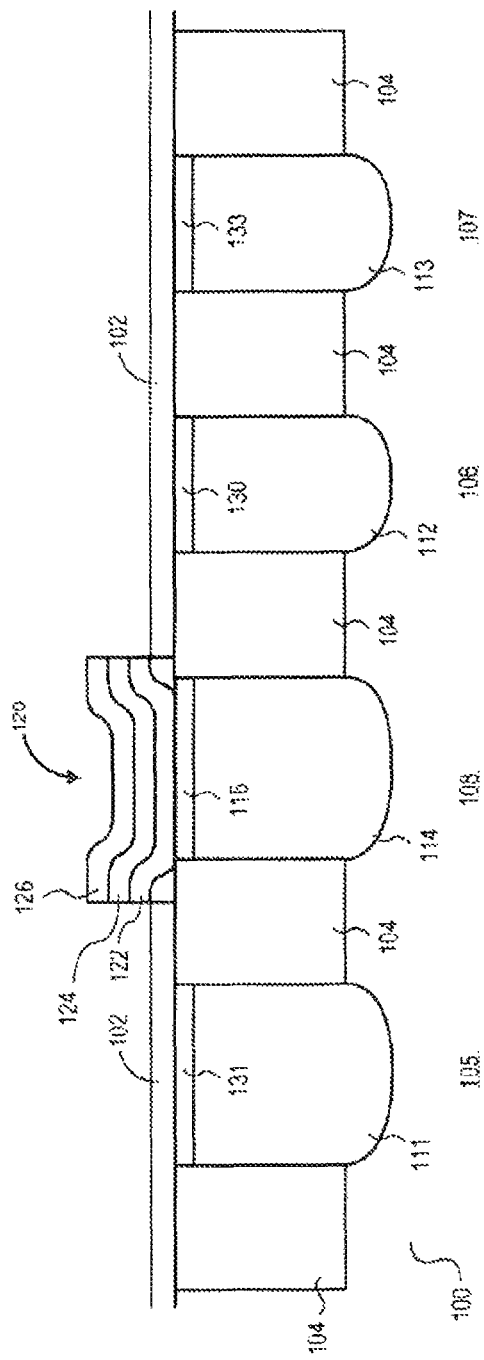

Referring to the embodiment of FIG. 5A, a photoresist layer 128 is formed above the substrate and patterned above the MOS device region 106. Dopants are implanted into the substrate 100 to form doped channel region 130. In an embodiment, pad layer 102 protects the top surface of substrate 100 from damage during the implantation operation. The lithographic and implantation techniques may be repeated to form doped channel regions 131 and 133 as illustrated in FIG. 5B.

Figure 6:
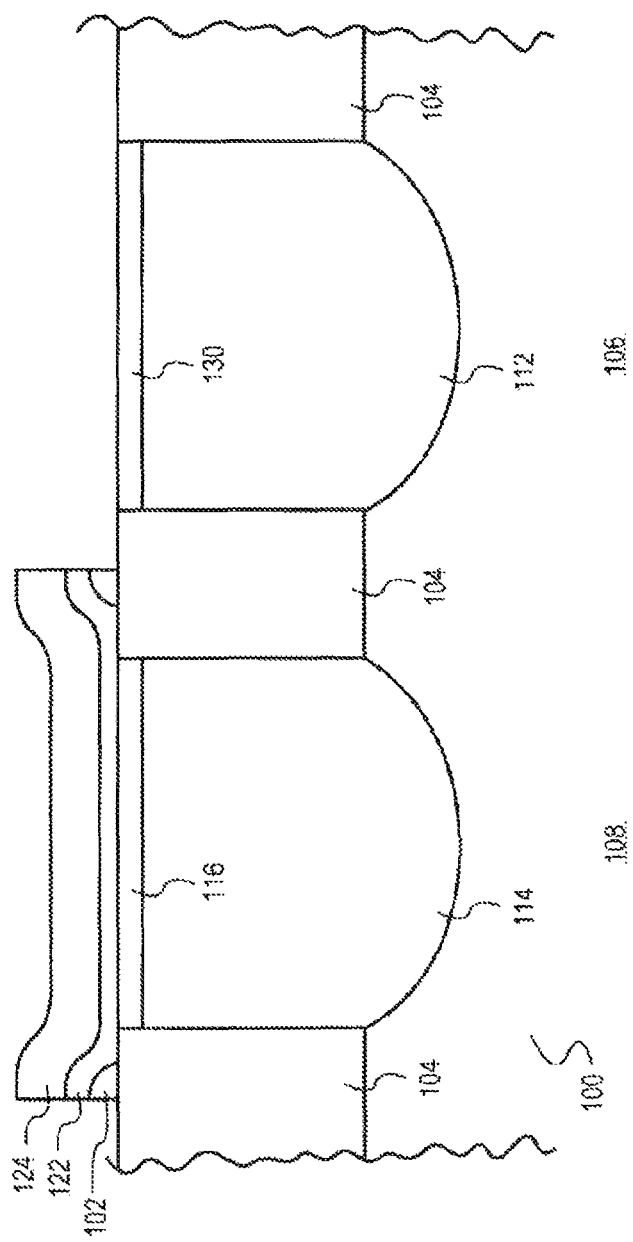
FIG. 6 illustrates the removal of a pad layer from a MOS device region and the removal of a sacrificial top layer from a non-volatile device region of a substrate, in accordance with an embodiment of the present invention.

Referring to FIG. 6, photoresist layer 128, pad layer 102 and sacrificial top layer 126 are removed. Photoresist layer 128 is removed utilizing any suitable photoresist removal chemistry. In an embodiment, pad layer 102 and sacrificial top layer 126 are simultaneously removed. In an embodiment, the substrate is exposed to a standard gate pre-clean chemistry such as a dilute HF solution or BOE solution to remove the sacrificial top layer 126 and pad layer 102. As illustrated in FIG. 6, some amount of pad oxide layer 102 may remain underneath an edge of tunnel layer 122 depending upon exposure time to gate pre-clean chemistry and method of forming tunnel layer 122.

Figure 7A:
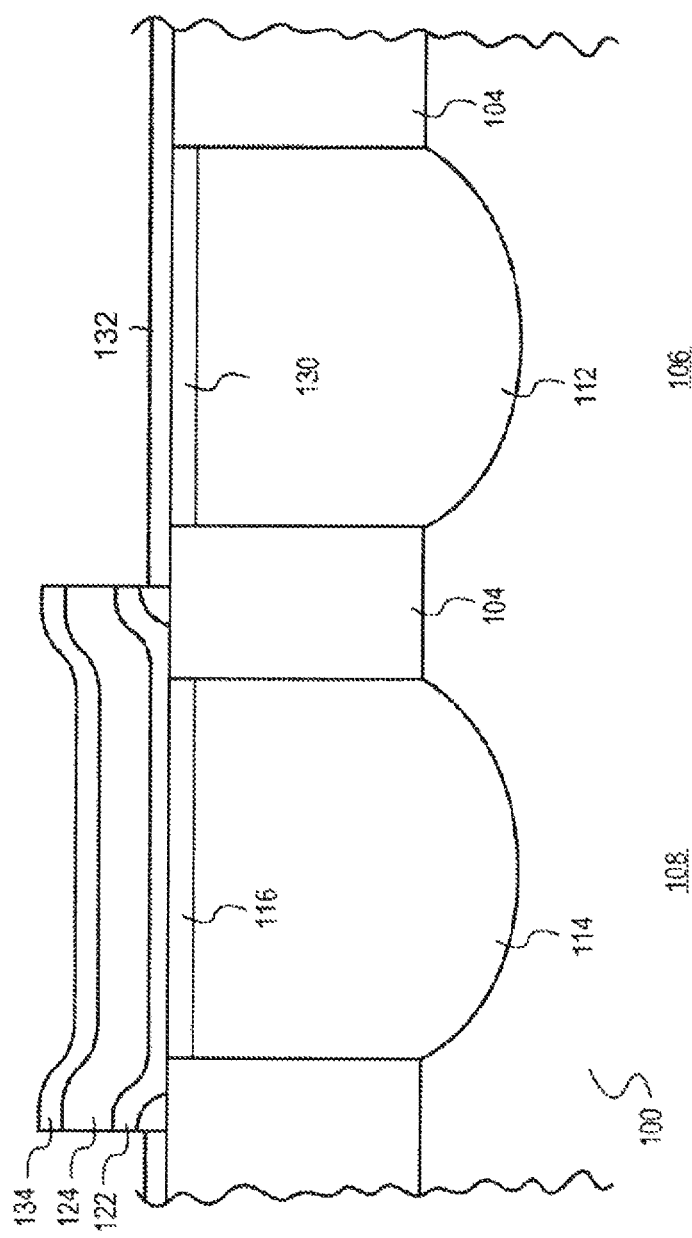
FIG. 7A illustrates the formation of a gate dielectric layer and blocking dielectric layer, in accordance with an embodiment of the present invention.

Referring to the embodiment of FIG. 7A, gate dielectric layer 132 and blocking dielectric layer 134 are simultaneously formed. Layers 132 and 134 may be formed utilizing any technique suitable for the formation of a MOS device gate dielectric layer. In an embodiment, layers 132 and 134 may be formed utilizing a technique capable of oxidizing both the substrate 100 and charge-trapping layer 124. In an embodiment gate dielectric layer 132 and blocking dielectric layer 134 are formed utilizing a radical oxidation technique, such as ISSG or plasma based oxidation, and consume a portion of the substrate 100 and charge-trapping layer 124, respectively.

In an embodiment, the thickness of the charge trapping layer 124 and the complete sacrificial layer 126 removal during the gate pre-clean operation illustrated in FIG. 6 can be tailored such that blocking dielectric layer 134 can be formed simultaneously with the gate dielectric layer 132 in accordance with an established MOSFET baseline process. Thus, charge trapping layer 124 can be integrated into an established baseline MOSFET process utilizing the same parameters as those established in the baseline MOSFET process for forming gate dielectric layer 132 in a non-integrated scheme. In addition, the high temperatures such as 750° C.-850° C. which may be used to form the dielectric gate stack 120 illustrated in FIG. 4 do not affect the baseline dopant profile in the non-volatile device doped channel region 130 because the tunnel layer 122 and charge-trapping layer 124 are formed prior to implanting the doped channel region 130, and blocking dielectric layer 134 is formed simultaneously with forming the gate dielectric layer 132. Accordingly, in such an embodiment any diffusion of channel dopants during formation of the gate dielectric layer 132 is accounted for in the baseline MOSFET logic manufacturing process.

In an embodiment, blocking dielectric layer 134 may be composed of any material and have any thickness suitable to maintain a barrier to charge leakage without significantly decreasing the capacitance of the non-volatile device gate stack. In one embodiment, the thickness of the blocking dielectric layer 134 is determined by the thickness for which gate dielectric layer 132 is to be made, and the composition of the uppermost part of charge-trapping layer 124. In an embodiment illustrated in FIG. 7B and FIG. 7C, blocking dielectric layer 134 is grown by consuming an upper portion of charge-trapping layer 124. In one embodiment illustrated in FIG. 7B, blocking dielectric layer 134 is grown by consuming a portion of upper layer 124B in FIG. 3B. In an embodiment, blocking dielectric layer 134 consumed approximately 25-35 angstroms of blocking dielectric layer 134. In one embodiment illustrated in FIG. 7C, blocking dielectric layer 134 is grown by consuming a portion of upper layer 124B in FIG. 3C. In an embodiment, the upper layer 124B' is completely consumed to provide a blocking dielectric layer 134 with uniform composition. In an embodiment, upper layer 124B' is completely consumed and less than 10% of the thickness of middle layer 124C' is consumed during the formation of blocking dielectric layer 134. In an embodiment, upper layer 124B or 124B' is silicon oxy-nitride containing approximately 30-57 atomic percent nitrogen. In such an embodiment, where blocking dielectric layer 134 is formed by ISSG, the blocking layer 134 may have a uniform silicon oxy-nitride composition containing less than 10 atomic percent nitrogen. In an embodiment, the thickness of the blocking dielectric layer 134 is approximately 25-35 angstroms.

In another embodiment, gate dielectric layer 132 and/or blocking dielectric layer 134 can include multiple layers. In an embodiment illustrated in FIG. 7D, a second dielectric layer 132B/134B is deposited above the oxidized portion 132A of the substrate and 134A of the charge-trapping layer. In an embodiment the second layer 132B/134B may have a larger dielectric constant than the underlying oxidized portion 132A/134A. For example, layer 132B/134B may comprise a material such as, but not limited to, aluminum oxide, hafnium oxide, zirconium oxide, hafnium oxy-nitride, hafnium zirconium oxide or lanthanum oxide.

Figure 8:
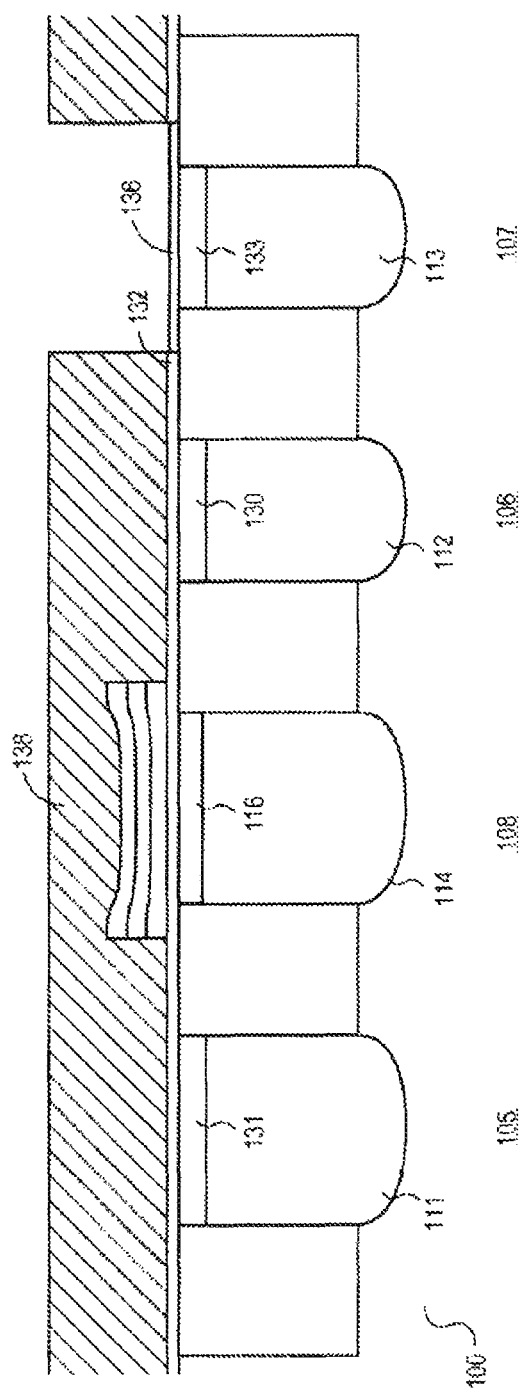
FIG. 8 illustrates the formation of a gate dielectric layer, in accordance with an embodiment of the present invention.

Referring to FIG. 8, in accordance with a specific embodiment a photoresist layer 138 is formed above the substrate and patterned to form an opening above LVFET region 107. Gate dielectric layer 132 is then removed from LVFET region 107. In an embodiment, gate dielectric layer 132 is removed by exposure to a dilute HF solution, or BOE solution. A replacement gate dielectric layer 136 is then formed above the exposed portion of substrate 100. Any suitable method for forming a gate dielectric layer in a MOS memory device may be utilized such as, but not limited to, dry oxidation or ISSG. Photoresist layer 138 is then removed from the substrate utilizing any suitable photoresist removal chemistry.

Figure 9:
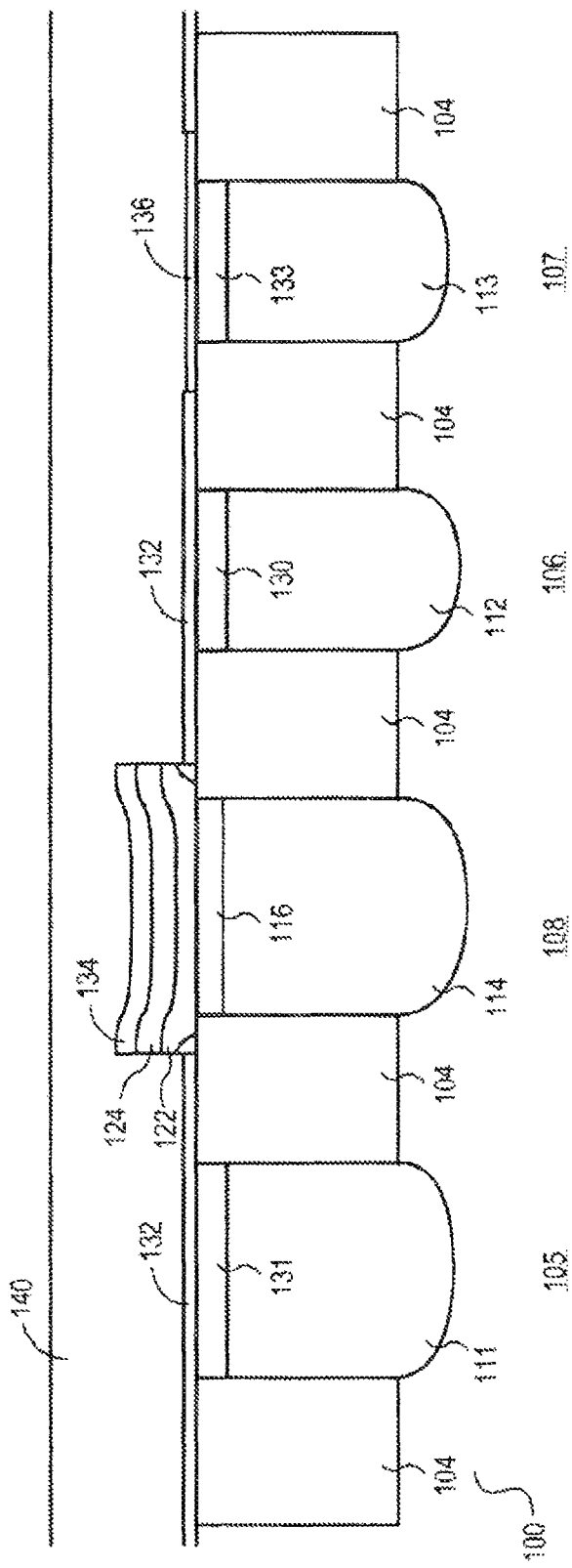
FIG. 9 illustrates the formation of a gate layer above a substrate, in accordance with an embodiment of the present invention.

Referring to the embodiment of FIG. 9, a gate layer 140 is then deposited above the substrate. Gate layer 140 may be composed of any conductor or semiconductor material suitable for accommodating a bias during operation of the non-volatile and MOS memory devices. In accordance with an embodiment, gate layer 140 is formed by a chemical vapor deposition process and is composed of doped polycrystalline silicon. In another embodiment, gate layer 140 is formed by physical vapor deposition and is composed of a metal-containing material which may include but is not limited to, metal nitrides, metal carbides, metal silicides, hafnium, zirconium, titanium, tantalum, aluminum, ruthenium, palladium, platinum, cobalt and nickel. In one embodiment, gate layer 140 is a high work-function gate layer.

Figure 10:
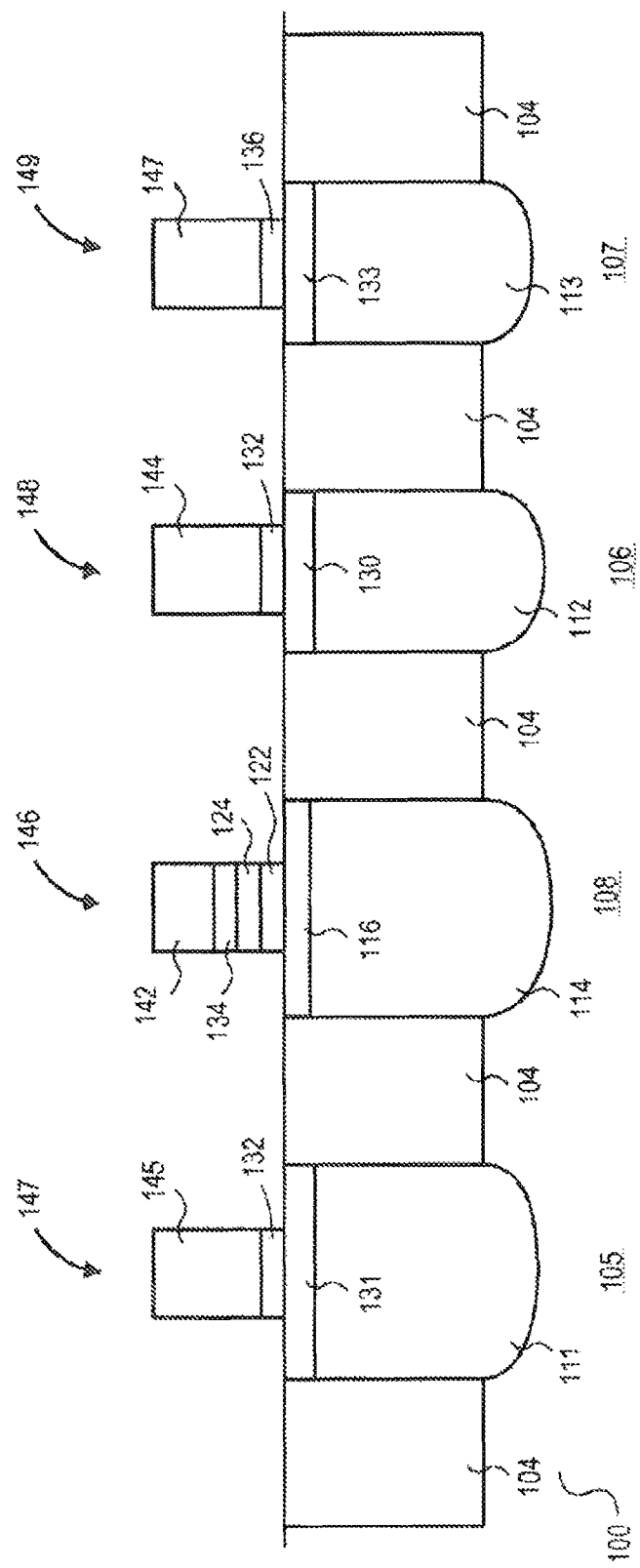
FIG. 10 illustrates the patterning of MOS device and non-volatile device gate stacks, in accordance with an embodiment of the present invention.

Referring to the embodiment of FIG. 10, non-volatile and MOS device gate stacks 146-149 may be formed through any process suitable to provide substantially straight sidewalls and with high selectivity to the substrate 100. In accordance with an embodiment, gate stacks 146-149 are patterned by lithography and etching. In an embodiment, etching is anisotropic and utilizes gases such as, but not limited to, carbon tetrafluoride ($CF_4$), $O_2$, hydrogen bromide (HBr) and chlorine ($Cl_2$). In a particular embodiment, HVFET gate stack 147 comprises gate layer 145 and gate dielectric layer 132. SONOS FET gate stack 146 comprises gate layer 142, blocking dielectric layer 134, charge-trapping layer 124, and tunnel layer 122. IO FET gate stack 148 comprises gate layer 144 and gate dielectric layer 132. LVFET gate stack 149 comprises gate layer 147 and gate dielectric layer 136.

Fabrication of MOS (e.g. MOSFET) and non-volatile (e.g. SONOS FET) memory devices may be completed utilizing conventional semiconductor processing techniques to form source and drain regions, spacers, and contact regions.

Implementations and Alternatives

In another aspect the present disclosure is directed to multigate or multigate-surface memory devices including charge-trapping regions overlying two or more sides of a channel formed on or above a surface of a substrate, and methods of fabricating the same. Multigate devices include both planar and non-planar devices. A planar multigate device (not shown) generally includes a double-gate planar device in which a number of first layers are deposited to form a first gate below a subsequently formed channel, and a number of second layers are deposited thereover to form a second gate. A non-planar multigate device generally includes a horizontal or vertical channel formed on or above a surface of a substrate and surrounded on three or more sides by a gate.

FIG. 11A illustrates one embodiment of a non-planar multigate memory device 1100 including a charge-trapping region formed above a first region of a substrate, and a MOS device 1101 integrally formed adjacent thereto in a second region. Referring to FIG. 11A, the memory device 1100, commonly referred to as a finFET, includes a channel 1102 formed from a thin film or layer of semiconducting material overlying a surface 1104 on a substrate 1106 connecting a source 1108 and a drain 1110 of the memory device. The channel 1102 is enclosed on three sides by a fin which forms a gate 1112 of the device. The thickness of the gate 1112 (measured in the direction from source to drain) determines the effective channel length of the device.

Figure 11B:
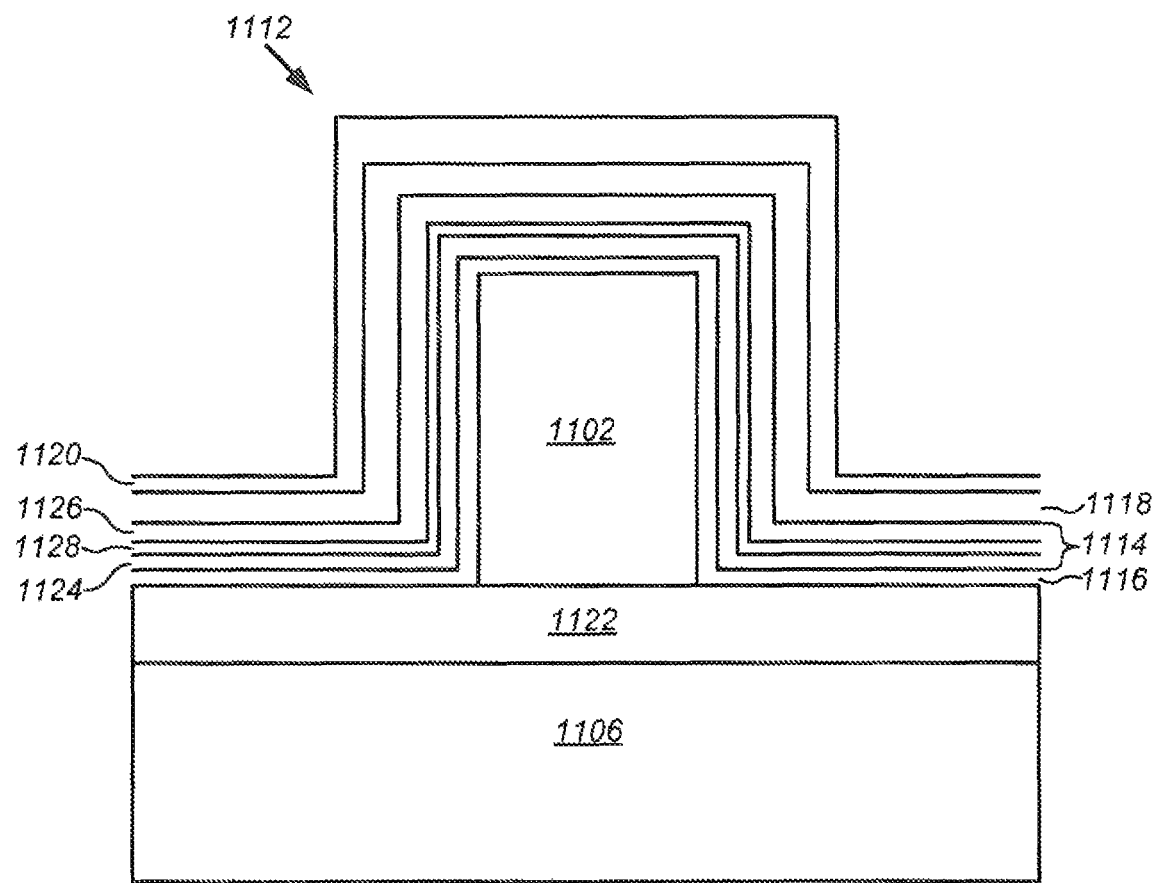
FIG. 11B illustrates a cross-sectional view of the non-planar multigate device of FIG. 11A.

In accordance with the present disclosure, the non-planar multigate memory device 1100 of FIG. 1A can include a split charge-trapping region. FIG. 11B is a cross-sectional view of a portion of the non-planar memory device of FIG. 11A including a portion of the substrate 1106, channel 1102 and the gate 1112 illustrating a split charge-trapping region 1114. The gate 1112 further includes a tunnel oxide 1116 overlying a raised channel 1102, a blocking dielectric 1118 and a metal gate layer 1120 overlying the blocking layer to form a control gate of the memory device 1100. In some embodiments a doped polysilicon may be deposited instead of metal to provide a polysilicon gate layer. The channel 1102 and gate 1112 can be formed directly on substrate 1106 or on an insulating or dielectric layer 1122, such as a buried oxide layer, formed on or over the substrate.

Referring to FIG. 11B, the split charge-trapping region 1114 includes at least one lower or bottom charge-trapping layer 1124 comprising nitride closer to the tunnel oxide 1116, and an upper or top charge-trapping layer 1126 overlying the bottom charge-trapping layer. Generally, the top charge-trapping layer 1126 comprises a silicon-rich, oxygen-lean nitride layer and comprises a majority of a charge traps distributed in multiple charge-trapping layers, while the bottom charge-trapping layer 1124 comprises an oxygen-rich nitride or silicon oxynitride, and is oxygen-rich relative to the top charge-trapping layer to reduce the number of charge traps therein. By oxygen-rich it is meant wherein a concentration of oxygen in the bottom charge-trapping layer 1124 is from about 15 to about 40%, whereas a concentration of oxygen in top charge-trapping layer 1126 is less than about 5%.

In one embodiment, the blocking dielectric 1118 also comprises an oxide, such as an HTO, to provide an ONNO structure. The channel 1102 and the overlying ONNO structure can be formed directly on a silicon substrate 1106 and overlaid with a doped polysilicon gate layer 1120 to provide a SONNOS structure.

In some embodiments, such as that shown in FIG. 11B, the split charge-trapping region 1114 further includes at least one thin, intermediate or anti-tunneling layer 1128 comprising a dielectric, such as an oxide, separating the top charge-trapping layer 1126 from the bottom charge-trapping layer 1124. The anti-tunneling layer 1128 substantially reduces the probability of electron charge that accumulates at the boundaries of the upper nitride layer 1126 during programming from tunneling into the bottom nitride layer 1124, resulting in lower leakage current than for the conventional structures.

As with the embodiments described above, either or both of the bottom charge-trapping layer 1124 and the top charge-trapping layer 1126 can comprise silicon nitride or silicon oxynitride, and can be formed, for example, by a CVD process including $N_2O/NH_3$ and $DCS/NH_3$ gas mixtures in ratios and at flow rates tailored to provide a silicon-rich and oxygen-rich oxynitride layer. The second nitride layer of the multi-layer charge storing structure is then formed on the middle oxide layer. The top charge-trapping layer 1126 has a stoichiometric composition of oxygen, nitrogen and/or silicon different from that of the bottom charge-trapping layer 1124, and may also be formed or deposited by a CVD process using a process gas including $DCS/NH_3$ and $N_2O/NH_3$ gas mixtures in ratios and at flow rates tailored to provide a silicon-rich, oxygen-lean top nitride layer.

In those embodiments including an intermediate or anti-tunneling layer 1128 comprising oxide, the anti-tunneling layer can be formed by oxidation of the bottom oxynitride layer, to a chosen depth using radical oxidation. Radical oxidation may be performed, for example, at a temperature of 1000-1100° C. using a single wafer tool, or 800-900° C. using a batch reactor tool. A mixture of $H_2$ and $O_2$ gasses may be employed at a pressure of 300-500 Tor for a batch process, or 10-15 Tor using a single vapor tool, for a time of 1-2 minutes using a single wafer tool, or 30 min-1 hour using a batch process.

Finally, in those embodiments including a blocking dielectric 1118 comprising oxide the oxide may be formed or deposited by any suitable means. In one embodiment the oxide of the blocking dielectric 1118 is a high temperature oxide deposited in a HTO CVD process. Alternatively, the blocking dielectric 1118 or blocking oxide layer may be thermally grown, however it will be appreciated that in this embodiment the top nitride thickness may be adjusted or increased as some of the top nitride will be effectively consumed or oxidized during the process of thermally growing the blocking oxide layer. A third option is to oxidize the top nitride layer to a chosen depth using radical oxidation.

A suitable thickness for the bottom charge-trapping layer 1124 may be from about 30 Å to about 80 Å (with some variance permitted, for example ±10 Å), of which about 5-20 Å may be consumed by radical oxidation to form the anti-tunneling layer 1128. A suitable thickness for the top charge-trapping layer 1126 may be at least 30 Å. In certain embodiments, the top charge-trapping layer 1126 may be formed up to 130 Å thick, of which 30-70 Å may be consumed by radical oxidation to form the blocking dielectric 1118. A ratio of thicknesses between the bottom charge-trapping layer 124 and top charge-trapping layer 1126 is approximately 1:1 in some embodiments, although other ratios are also possible.

In other embodiments, either or both of the top charge-trapping layer 1126 and the blocking dielectric 1118 may comprise a high K dielectric. Suitable high K dielectrics include hafnium based materials such as HfSiON, HfSiO or HfO, Zirconium based material such as ZrSiON, ZrSiO or ZrO, and Yttrium based material such as $Y_2O_3$.

Figure 11C:
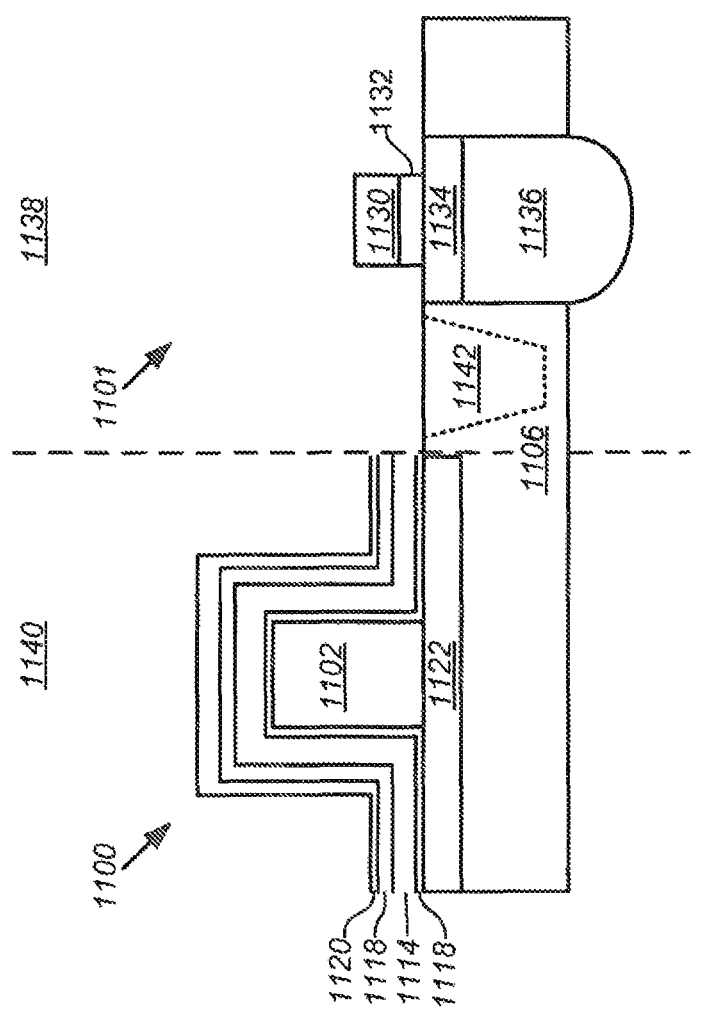
FIG. 11C illustrates a multigate device that includes a planar device.

In the embodiment shown in FIG. 1A, the MOS device 1101 is also a finFET, and includes a channel 1103 formed from a thin film or layer of semiconducting material overlying the surface 1104 on the substrate 1106 connecting a source 1105 and a drain 1107 of the MOS device. The channel 1103 is also enclosed on three sides by the fin which forms a gate of the device. However, the MOS device 1101 can also include a planar device, as shown in FIG. 11C, formed in or on the surface of the substrate by any of methods or embodiments described above with respect to FIGS. 1A-10. For example, in one embodiment the MOS device 1101 is a FET including a gate 1130 and gate dielectric layer 1132 overlying a doped channel region 1134 in a deep well 1136 formed in a second region 1138 of the substrate, and separated from the memory device 1100 in the first region 1140 by an isolation region 1142, such as a shallow trench isolation region. In certain embodiments, forming the MOS device 1101 comprises performing a thermal oxidation to simultaneously form the gate dielectric layer 1132 of the MOS device while thermally reoxidizing the blocking layer 1118. In one particular embodiment, the method can further comprise performing a nitridation process as described above to simultaneously nitridize the gate dielectric layer 1132 and the blocking layer 1118.

Figure 12:
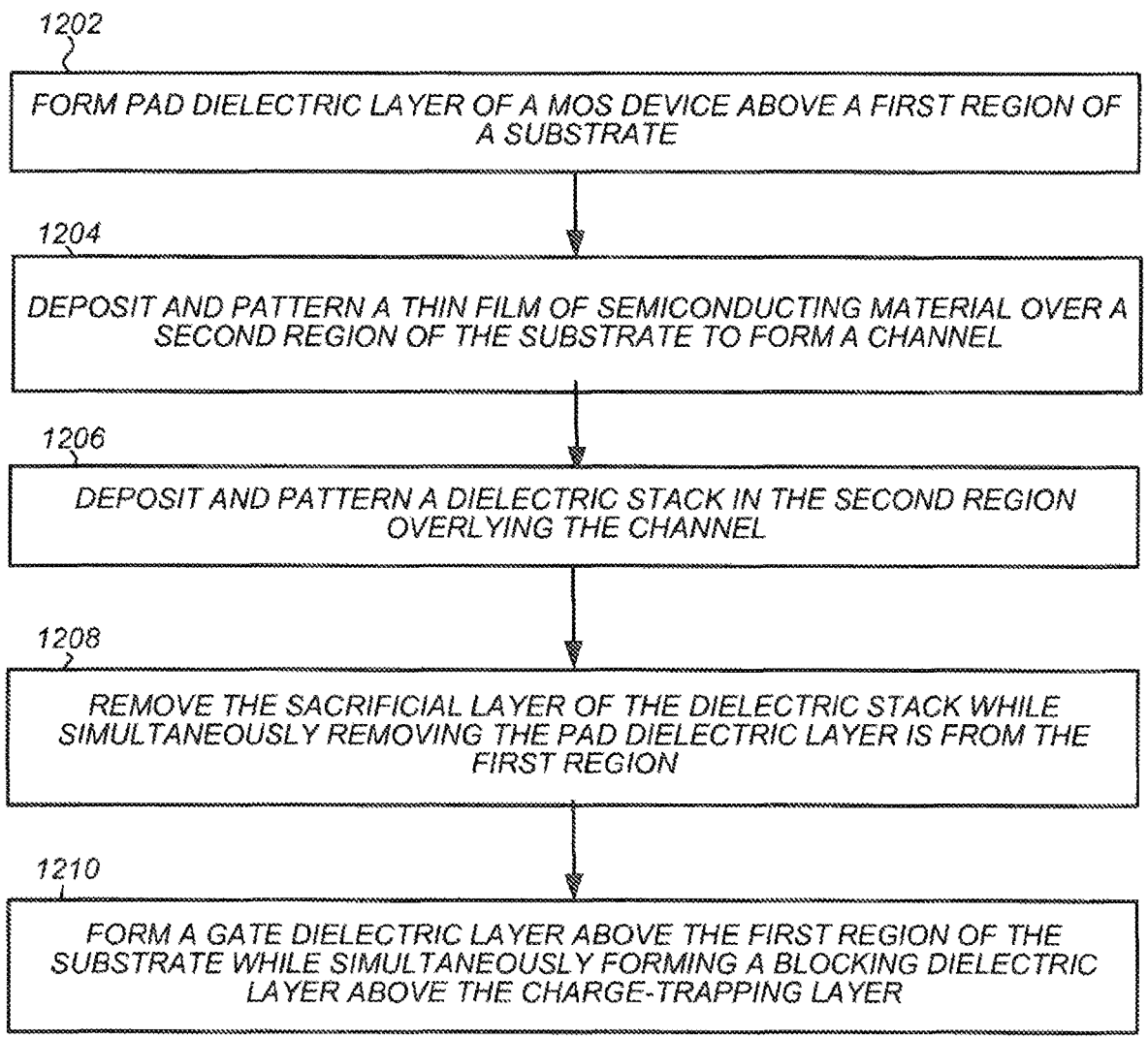
FIG. 12 illustrates a flow diagram depicting sequences of particular modules employed in the fabricating a non-planar multigate device integrated with a logic MOS device.

FIG. 12 illustrates a flow diagram depicting sequences of particular modules employed in the fabrication process of a non-volatile charge trap memory device integrated with a logic MOS device, in accordance with particular embodiments of the present invention. Referring to FIG. 12, the method begins with formation of a pad dielectric layer of a MOS device above a first or MOS region of a substrate (module 1202). A pad dielectric layer may be deposited or grown above by any conventional technique, such as, but not limited to thermally grown with a dry oxidation technique at a temperature of 800° C.-900° C. to a thickness of approximately 100 Å. To include a non-planar, multigate nonvolatile memory device on the same substrate as the MOS device, a thin film of semiconducting material is formed over a surface of the substrate in a second, memory device region, and patterned to form a channel connecting a source and a drain of the memory device (module 1204). The thin film of semiconducting material may be composed of a single crystal of a material which may include, but not limited to, silicon, germanium, silicon-germanium or a III-V compound semiconductor material deposited by any conventional technique, such as, but not limited to epitaxial deposition in a LPCVD chamber.

A patterned dielectric stack of the non-volatile memory device is formed over the second, memory device region, and patterned to remove that portion of the dielectric stack not overlying the channel (module 1206). The dielectric stack generally includes a tunnel layer, a charge-trapping layer, and a sacrificial top layer overlying the charge-trapping layer. The individual layers of the dielectric stack can include silicon oxides, silicon nitrides and silicon nitrides having various stoichiometric compositions of oxygen, nitrogen and/or silicon, and may deposited or grown by any conventional technique, such as, but not limited to thermally grown oxides, radical oxidation and CVD processes, as described above.

Next, in some embodiments the sacrificial layer is removed from the top of the dielectric stack while the pad dielectric layer is simultaneously removed from the first region of the substrate (module 1208), and a gate dielectric layer formed above the first region of the substrate while a blocking dielectric layer is simultaneously formed above the charge-trapping layer (module 1210). Generally, the sacrificial layer and pad layer are removed by exposing the substrate to a standard gate pre-clean chemistry such as a dilute HF solution or BOE solution to remove. The gate dielectric layer and the blocking dielectric layer may be formed utilizing a technique capable of oxidizing both the substrate and charge-trapping layer. In one embodiment the gate dielectric layer and blocking dielectric layer are formed utilizing a radical oxidation technique, such as ISSG or plasma based oxidation, which consume a portion of the substrate and charge-trapping layer, respectively.

In another embodiment, shown in FIGS. 13A and 13B, the memory device can include a nanowire channel formed from a thin film of semiconducting material overlying a surface on a substrate connecting a source and a drain of the memory device. By nanowire channel it is meant a conducting channel formed in a thin strip of crystalline silicon material, having a maximum cross-sectional dimension of about 10 nanometers (nm) or less, and more preferably less than about 6 nm. Optionally, the channel can be formed to have <100> surface crystalline orientation relative to a long axis of the channel.

Referring to FIG. 13A, the memory device 1300 includes a horizontal nanowire channel 1302 formed from a thin film or layer of semiconducting material on or overlying a surface on a substrate 1306, and connecting a source 1308 and a drain 1310 of the memory device. In the embodiment shown, the device has a gate-all-around (GAA) structure in which the nanowire channel 1302 is enclosed on all sides by a gate 1312 of the device. The thickness of the gate 1312 (measured in the direction from source to drain) determines the effective channel length of the device.

In accordance with the present disclosure, the non-planar multigate memory device 1300 of FIG. 13A can include a split charge-trapping region. FIG. 13B is a cross-sectional view of a portion of the non-planar memory device of FIG. 13A including a portion of the substrate 1306, nanowire channel 1302 and the gate 1312 illustrating a split charge-trapping region. Referring to FIG. 13B, the gate 1312 includes a tunnel oxide 1314 overlying the nanowire channel 1302, a split charge-trapping region, a blocking dielectric 1316 and a gate layer 1318 overlying the blocking layer to form a control gate of the memory device 1300. The gate layer 1318 can comprise a metal or a doped polysilicon. The split charge-trapping region includes at least one inner charge-trapping layer 1320 comprising nitride closer to the tunnel oxide 1314, and an outer charge-trapping layer 1322 overlying the inner charge-trapping layer. Generally, the outer charge-trapping layer 1322 comprises a silicon-rich, oxygen-lean nitride layer and comprises a majority of a charge traps distributed in multiple charge-trapping layers, while the inner charge-trapping layer 1320 comprises an oxygen-rich nitride or silicon oxynitride, and is oxygen-rich relative to the outer charge-trapping layer to reduce the number of charge traps therein.

In some embodiments, such as that shown, the split charge-trapping region further includes at least one thin, intermediate or anti-tunneling layer 1324 comprising a dielectric, such as an oxide, separating outer charge-trapping layer 1322 from the inner charge-trapping layer 1320. The anti-tunneling layer 1324 substantially reduces the probability of electron charge that accumulates at the boundaries of outer charge-trapping layer 1322 during programming from tunneling into the inner charge-trapping layer 1320, resulting in lower leakage current.

As with the embodiment described above, either or both of the inner charge-trapping layer 1320 and the outer charge-trapping layer 1322 can comprise silicon nitride or silicon oxynitride, and can be formed, for example, by a CVD process including $N_2O/NH_3$ and $DCS/NH_3$ gas mixtures in ratios and at flow rates tailored to provide a silicon-rich and oxygen-rich oxynitride layer. The second nitride layer of the multi-layer charge storing structure is then formed on the middle oxide layer. The outer charge-trapping layer 1322 has a stoichiometric composition of oxygen, nitrogen and/or silicon different from that of the inner charge-trapping layer 1320, and may also be formed or deposited by a CVD process using a process gas including $DCS/NH_3$ and $N_2O/NH_3$ gas mixtures in ratios and at flow rates tailored to provide a silicon-rich, oxygen-lean top nitride layer.

In those embodiments including an intermediate or anti-tunneling layer 1324 comprising oxide, the anti-tunneling layer can be formed by oxidation of the inner charge-trapping layer 1320, to a chosen depth using radical oxidation. Radical oxidation may be performed, for example, at a temperature of 1000-1100° C. using a single wafer tool, or 800-900° C. using a batch reactor tool. A mixture of $H_2$ and $O_2$ gasses may be employed at a pressure of 300-500 Tor for a batch process, or 10-15 Tor using a single vapor tool, for a time of 1-2 minutes using a single wafer tool, or 30 min-1 hour using a batch process.

Finally, in those embodiments in which the blocking dielectric 1316 comprises oxide, the oxide may be formed or deposited by any suitable means. In one embodiment the oxide of blocking dielectric 1316 is a high temperature oxide deposited in a HTO CVD process. Alternatively, the blocking dielectric 1316 or blocking oxide layer may be thermally grown, however it will be appreciated that in this embodiment the thickness of the outer charge-trapping layer 1322 may need to be adjusted or increased as some of the top nitride will be effectively consumed or oxidized during the process of thermally growing the blocking oxide layer.

A suitable thickness for the inner charge-trapping layer 1320 may be from about 30 Å to about 80 Å (with some variance permitted, for example ±10 Å), of which about 5-20 Å may be consumed by radical oxidation to form the anti-tunneling layer 1324. A suitable thickness for the outer charge-trapping layer 1322 may be at least 30 Å. In certain embodiments, the outer charge-trapping layer 1322 may be formed up to 130 Å thick, of which 30-70 Å may be consumed by radical oxidation to form the blocking dielectric 1316. A ratio of thicknesses between the inner charge-trapping layer 1320 and the outer charge-trapping layer 1322 is approximately 1:1 in some embodiments, although other ratios are also possible.

In other embodiments, either or both of the outer charge-trapping layer 1322 and the blocking dielectric 1316 may comprise a high K dielectric. Suitable high K dielectrics include hafnium based materials such as HfSiON, HfSiO or HfO, Zirconium based material such as ZrSiON, ZrSiO or ZrO, and Yttrium based material such as $Y_2O_3$.

FIG. 13C illustrates a cross-sectional view of a vertical string of non-planar multigate devices 1300 of FIG. 13A arranged in a Bit-Cost Scalable or BiCS architecture 1326. The architecture 1326 consists of a vertical string or stack of non-planar multigate devices 1300, where each device or cell includes a channel 1302 overlying the substrate 1306, and connecting a source and a drain (not shown in this figure) of the memory device, and having a gate-all-around (GAA) structure in which the nanowire channel 1302 is enclosed on all sides by a gate 1312. The BiCS architecture reduces number of critical lithography steps compared to a simple stacking of layers, leading to a reduced cost per memory bit.

In another embodiment, the memory device is or includes a non-planar device comprising a vertical nanowire channel formed in or from a semiconducting material projecting above or from a number of conducting, semiconducting layers on a substrate. In one version of this embodiment, shown in cut-away in FIG. 14A, the memory device 1400 comprises a vertical nanowire channel 1402 formed in a cylinder of semiconducting material connecting a source 1404 and drain 1406 of the device. The channel 1402 is surrounded by a tunnel oxide 1408, a charge-trapping region 1410, a blocking layer 1412 and a gate layer 1414 overlying the blocking layer to form a control gate of the memory device 1400. The channel 1402 can include an annular region in an outer layer of a substantially solid cylinder of semiconducting material, or can include an annular layer formed over a cylinder of dielectric filler material. As with the horizontal nanowires described above, the channel 1402 can comprise polysilicon or recrystallized polysilicon to form a monocrystalline channel. Optionally, where the channel 1402 includes a crystalline silicon, the channel can be formed to have <100> surface crystalline orientation relative to a long axis of the channel.

Figure 14A:
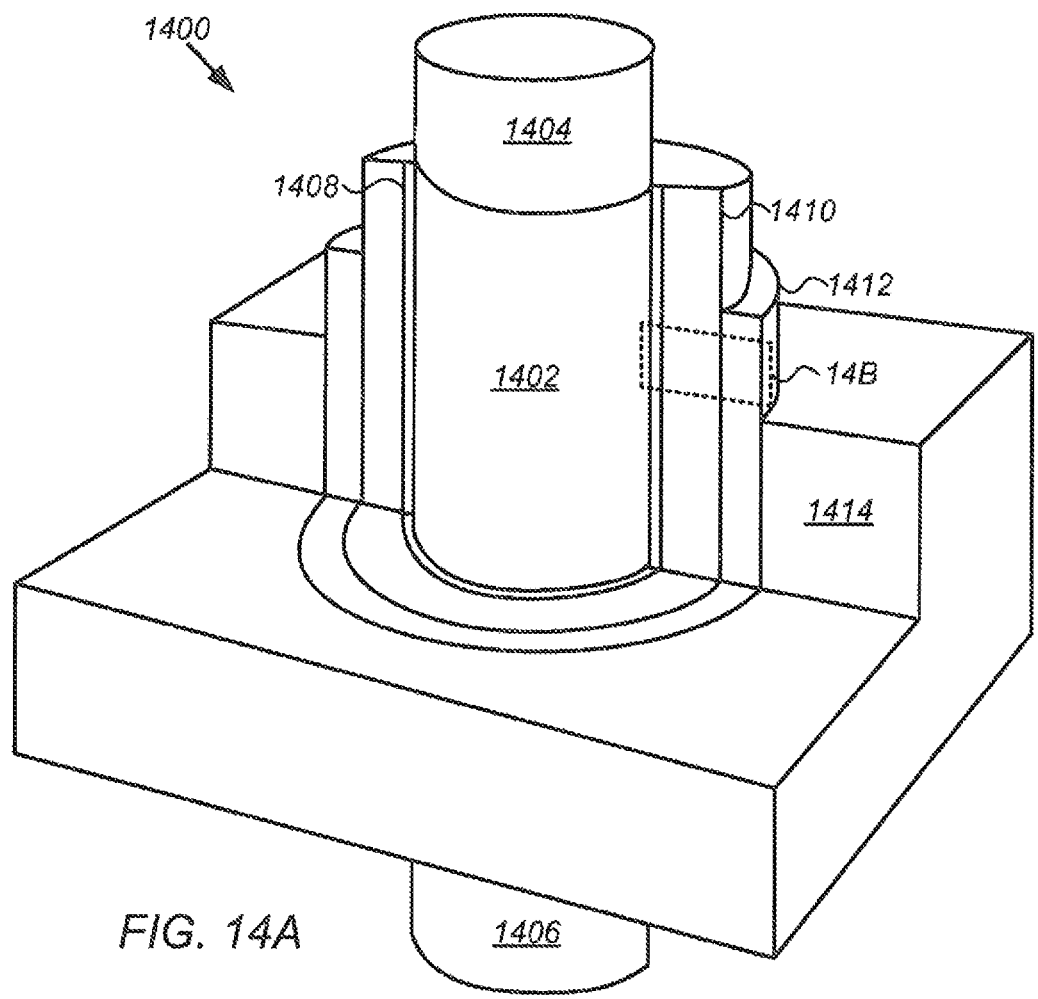
FIGS. 14A and 14B illustrate a non-planar multigate device including a split charge-trapping region and a vertical nanowire channel.
Figure 14B:
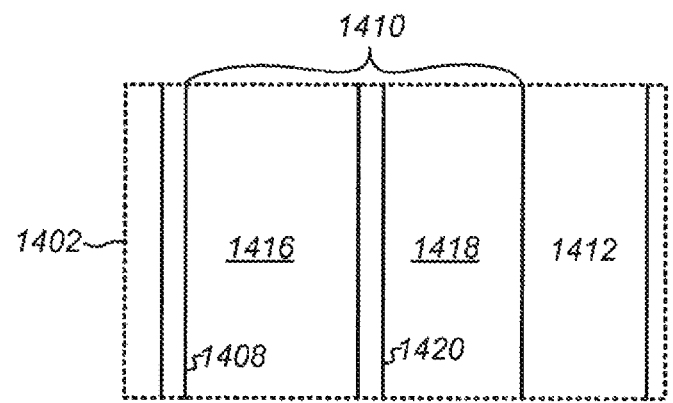

In some embodiments, such as that shown in FIG. 14B, the charge-trapping region 1410 can be a split charge-trapping region including at least a first or inner charge trapping layer 1416 closest to the tunnel oxide 1408, and a second or outer charge trapping layer 1418. Optionally, the first and second charge trapping layers can be separated by an intermediate oxide or anti-tunneling layer 1420.

As with the embodiments described above, either or both of the first charge trapping layer 1416 and the second charge trapping layer 1418 can comprise silicon nitride or silicon oxynitride, and can be formed, for example, by a CVD process including $N_2O/NH_3$ and $DCS/NH_3$ gas mixtures in ratios and at flow rates tailored to provide a silicon-rich and oxygen-rich oxynitride layer.

Finally, either or both of the second charge trapping layer 1418 and the blocking layer 1412 may comprise a high K dielectric, such as HfSiON, HfSiO, HfO, ZrSiON, ZrSiO, ZrO, or $Y_2O_3$.

A suitable thickness for the first charge trapping layer 1416 may be from about 30 Å to about 80 Å (with some variance permitted, for example ±10 Å), of which about 5-20 Å may be consumed by radical oxidation to form the anti-tunneling layer 1420. A suitable thickness for the second charge trapping layer 1418 may be at least 30 Å, and a suitable thickness for the blocking dielectric 1412 may be from about 30-70 Å.

The memory device 1400 of FIG. 14A can be made using either a gate first or a gate last scheme. FIG. 15A-F illustrate a gate first scheme for fabricating the non-planar multigate device of FIG. 14A. FIG. 16A-F illustrate a gate last scheme for fabricating the non-planar multigate device of FIG. 14A.

Figure 15A:
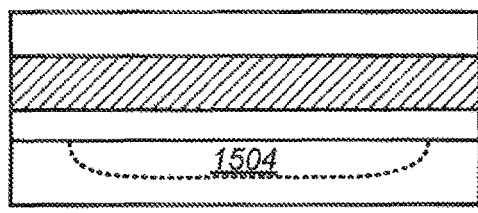
FIGS. 15A-15F illustrate a gate first scheme for fabricating the non-planar multigate device of FIG. 14A.

Referring to FIG. 15A, in a gate first scheme a first or lower dielectric layer 1502, such as a blocking oxide, is formed over a first, doped diffusion region 1504, such as a source or a drain, in a substrate 1506. A gate layer 1508 is deposited over the first dielectric layer 1502 to form a control gate of the device, and a second or upper dielectric layer 1510 formed thereover. As with embodiments described above, the first and second dielectric layers 1502, 1510, can be deposited by CVD, radical oxidation or be formed by oxidation of a portion of the underlying layer or substrate. The gate layer 1508 can comprise a metal deposited or a doped polysilicon deposited by CVD. Generally the thickness of the gate layer 1508 is from about 40-50 Å, and the first and second dielectric layers 1502, 1510, from about 20-80 Å.

Figure 15B:
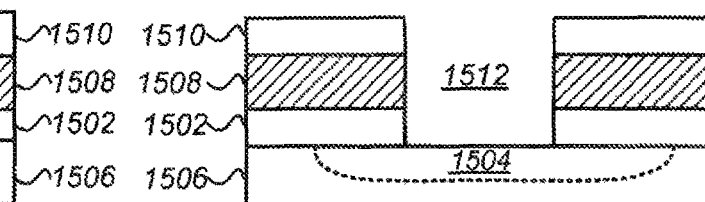
Figure 15C:
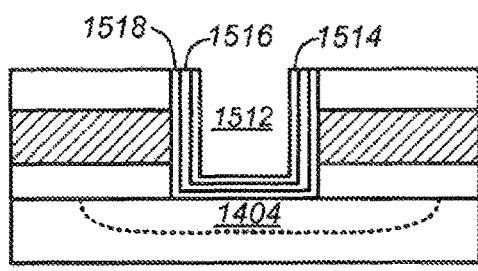

Referring to FIG. 15B, a first opening 1512 is etched through the overlying gate layer 1508, and the first and second dielectric layers 1502, 1510, to the diffusion region 1504 in the substrate 1506. Next, layers of a tunneling oxide 1514, charge-trapping region 1516, and blocking dielectric 1518 are sequentially deposited in the opening and the surface of the upper dielectric layer 1510 planarize to yield the intermediate structure shown in FIG. 15C.

Although not shown, it will be understood that as in the embodiments described above the charge-trapping region 1516 can include a split charge-trapping region comprising at least one lower or bottom charge-trapping layer closer to the tunnel oxide 1514, and an upper or top charge-trapping layer overlying the bottom charge-trapping layer. Generally, the top charge-trapping layer comprises a silicon-rich, oxygen-lean nitride layer and comprises a majority of a charge traps distributed in multiple charge-trapping layers, while the bottom charge-trapping layer comprises an oxygen-rich nitride or silicon oxynitride, and is oxygen-rich relative to the top charge-trapping layer to reduce the number of charge traps therein. In some embodiments, the split charge-trapping region 1516 further includes at least one thin, intermediate or anti-tunneling layer comprising a dielectric, such as an oxide, separating the top charge-trapping layer from the bottom charge-trapping layer.

Figure 15D:
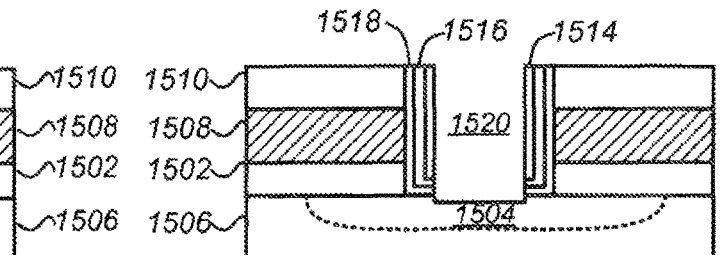
Figure 15E:
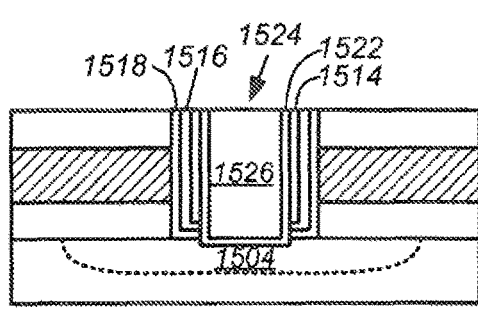

Next, a second or channel opening 1520 is anisotropically etched through tunneling oxide 1514, charge-trapping region 1516, and blocking dielectric 1518, FIG. 15D. Referring to FIG. 15E, a semiconducting material 1522 is deposited in the channel opening to form a vertical channel 1524 therein. The vertical channel 1524 can include an annular region in an outer layer of a substantially solid cylinder of semiconducting material, or, as shown in FIG. 15E, can include a separate, layer semiconducting material 1522 surrounding a cylinder of dielectric filler material 1526.

Figure 15F:
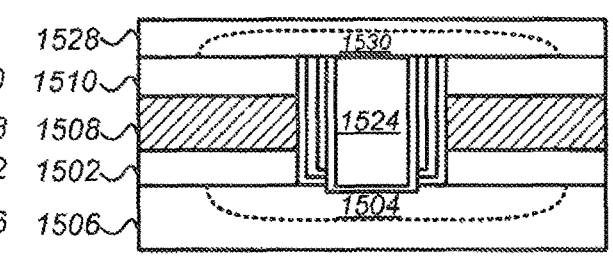

Referring to FIG. 15F, the surface of the upper dielectric layer 1510 is planarized and a layer of semiconducting material 1528 including a second, doped diffusion region 1530, such as a source or a drain, formed therein deposited over the upper dielectric layer to form the device shown.

Figure 16A:
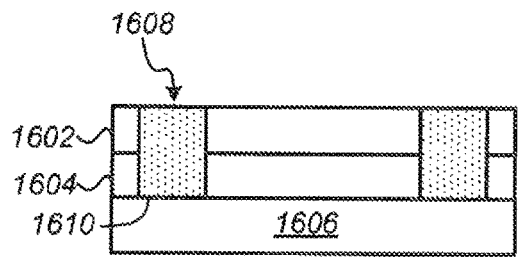
FIGS. 16A-16F illustrate a gate last scheme for fabricating the non-planar multigate device of FIG. 14A.

Referring to FIG. 16A, in a gate last scheme a dielectric layer 1602, such as an oxide, is formed over a sacrificial layer 1604 on a surface on a substrate 1606, an opening etched through the dielectric and sacrificial layers and a vertical channel 1608 formed therein. As with embodiments described above, the vertical channel 1608 can include an annular region in an outer layer of a substantially solid cylinder of semiconducting material 1610, such as a polycrystalline or monocrystalline silicon, or can include a separate, layer semiconducting material surrounding a cylinder of dielectric filler material (not shown). The dielectric layer 1602 can comprise any suitable dielectric material, such as a silicon oxide, capable of electrically isolating the subsequently formed gate layer of the memory device 1400 from an overlying electrically active layer or another memory device. The sacrificial layer 1604 can comprise any suitable material that can be etched or removed with high selectivity relative to the material of the dielectric layer 1602, substrate 1606 and vertical channel 1608.

Figure 16B:
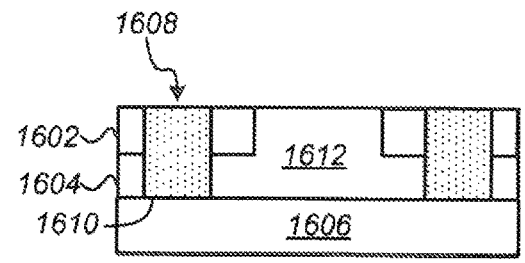

Referring to FIG. 16B, a second opening 1612 is etched through the etched through the dielectric and sacrificial layers 1602, 1604, to the substrate 1506, and the sacrificial layer 1604 etched or removed. The sacrificial layer 1604 can comprise any suitable material that can be etched or removed with high selectivity relative to the material of the dielectric layer 1602, substrate 1606 and vertical channel 1608. In one embodiment the sacrificial layer 1604 comprises silicon dioxide that can be removed by a buffered oxide (BOE) etch.

Figure 16C:
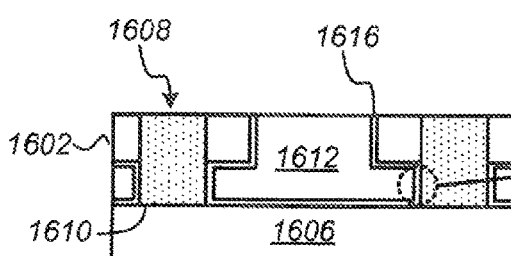
Figure 16D:
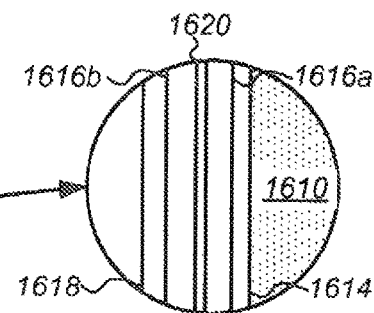

Referring to FIGS. 16C and 16D, layers of a tunneling oxide 1614, charge-trapping region 1616, and blocking dielectric 1618 are sequentially deposited in the opening. The surface of the dielectric layer 1602 is planarized to yield the intermediate structure shown in FIG. 16C. In some embodiments, such as that shown in FIG. 16D, the charge-trapping region 1616 can be a split charge-trapping region including at least a first or inner charge trapping layer 1616a closest to the tunnel oxide 1614, and a second or outer charge trapping layer 1616b. Optionally, the first and second charge trapping layers can be separated by an intermediate oxide or anti-tunneling layer 1620.

Figure 16E:
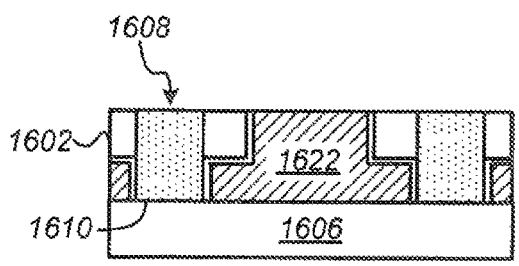
Figure 16F:
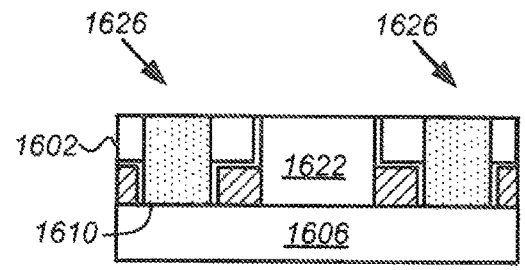

Next, a gate layer 1622 is deposited into the second opening 1612 and the surface of the upper dielectric layer 1602 planarized to yield the intermediate structure illustrated in FIG. 16E. As with embodiments described above, the gate layer 1622 can comprise a metal deposited or a doped polysilicon. Finally, an opening 1624 is etched through the gate layer 1622 to form control gate of separate memory devices 1626.

In the foregoing specification, various embodiments of the invention have been described for integrating non-volatile and MOS memory devices. In an embodiment, the dielectric gate stack of the non-volatile device can be integrated into the MOS memory process flow without affecting the baseline process for forming the MOS device channel dopants and gate dielectric layer. It is appreciated that embodiments are not so limited. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A non-volatile memory device, comprising:
    a control gate layer over a semiconductor substrate;
    a through hole vertically penetrating the control gate layer;
    a blocking dielectric layer, a charge storing layer and a tunnel dielectric layer in this order on a sidewall of the through hole;

a semiconductor layer on the tunnel dielectric layer within the through hole; and a dielectric filler material filling the through hole such that the semiconductor layer surrounds the dielectric filler material, wherein the charge storing layer comprises a first charge trapping layer and a second charge trapping layer, the first charge trapping layer is closer to the tunnel dielectric layer and comprises a first oxygen-rich silicon oxynitride layer, and the second charge trapping layer is closer to the blocking dielectric layer and comprises a second oxygen-lean silicon oxynitride layer.

2. The non-volatile memory device in claim 1, wherein the control gate layer is immediately adjacent to and sandwiched between a lower dielectric layer and an upper dielectric layer.

3. The non-volatile memory device in claim 2, wherein the through hole vertically penetrating the lower and upper dielectric layers.

4. The non-volatile memory device in claim 1, wherein the semiconductor layer is a polysilicon layer.

5. The non-volatile memory device in claim 1, wherein the control gate layer is formed with doped polysilicon material.

6. The non-volatile memory device in claim 1, wherein the control gate layer is formed with high working function material.

7. The non-volatile memory device in claim 1, wherein the second charge trapping layer comprises a high K dielectric.

8. The non-volatile memory device in claim 7, wherein the high K dielectric comprises a compound including hafnium (Hf) or zirconium (Zr).

9. The non-volatile memory device in claim 1, further comprising an anti-tunneling layer disposed between the first and second charge trapping layers.

10. The non-volatile memory device in claim 1, wherein the blocking dielectric layer comprises a high K dielectric compound including hafnium (Hf) or zirconium (Zr).

11. The non-volatile memory device in claim 1, further comprising forming an anti-tunnel layer separating the first oxygen-rich silicon oxynitride layer and the second oxygen-lean silicon oxynitride layer.

12. The non-volatile memory device in claim 11, wherein the anti-tunnel layer comprising an oxide layer.

13. A non-volatile memory device, comprising:
a control gate layer over a semiconductor substrate;
a through hole vertically penetrating the control gate layer;
a blocking dielectric layer, a charge storing layer and a tunnel dielectric layer in this order on a sidewall of the through hole;
a semiconductor layer on the tunnel dielectric layer within the through hole; and
a dielectric filler material within the through hole such that the semiconductor layer surrounds the dielectric filler material, wherein the charge storing layer comprises a first charge trapping layer and a second charge trapping layer;
wherein the first charge trapping layer is closer to the tunnel dielectric layer and comprises a first oxygen-rich silicon oxynitride layer, the second charge trapping layer is closer to the blocking dielectric layer and comprises a second oxygen-lean silicon oxynitride layer.

14. The non-volatile memory device in claim 13, wherein the control gate layer is immediately adjacent to and sandwiched between a lower dielectric layer and an upper dielectric layer.

15. The non-volatile memory device in claim 14, wherein the through hole vertically penetrating the lower and upper dielectric layers.

16. The non-volatile memory device in claim 13, wherein the semiconductor layer is a polysilicon layer.

17. The non-volatile memory device in claim 13, wherein the control gate layer is formed with doped polysilicon material.

18. The non-volatile memory device in claim 13, wherein the control gate layer is formed with high working function material.

* * * * *